US012772896B2

(12) United States Patent
Shiroshita et al.

(10) Patent No.: US 12,772,896 B2
(45) Date of Patent: Oct. 20, 2026

(54) SEMICONDUCTOR DEVICE AND METHOD OF MANUFACTURING SEMICONDUCTOR DEVICE

(71) Applicant: Kioxia Corporation, Tokyo (JP)

(72) Inventors: Naoya Shiroshita, Fujisawa Kanagawa (JP); Masayuki Miura, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 384 days.

(21) Appl. No.: 18/459,841

(22) Filed: Sep. 1, 2023

(65) Prior Publication Data

US 2024/0105539 A1 Mar. 28, 2024

(30) Foreign Application Priority Data

Sep. 22, 2022 (JP) ................................ 2022-150876

(51) Int. Cl.

| | |
|---|---|
| ***H10W 74/10*** | (2026.01) |
| ***H10W 42/00*** | (2026.01) |
| ***H10W 74/01*** | (2026.01) |
| ***H10W 74/47*** | (2026.01) |

(52) U.S. Cl.

CPC ....... *H10W 74/121* (2026.01); *H10W 42/121* (2026.01); *H10W 74/01* (2026.01); *H10W 74/473* (2026.01)

(58) Field of Classification Search

CPC ... H01L 23/3135; H01L 21/56; H01L 23/295; H01L 23/562

See application file for complete search history.

(56) References Cited

U.S. PATENT DOCUMENTS

| | | | | |
|---|---|---|---|---|
| 5,606,200 | A * | 2/1997 | Haraguchi | H01L 23/06 257/788 |
| 9,287,174 | B2 | 3/2016 | Sekiguchi et al. | |
| 11,069,588 | B2 | 7/2021 | Oh et al. | |
| 2006/0061971 | A1* | 3/2006 | Inoue | H01L 23/24 257/E23.181 |
| 2014/0038360 | A1* | 2/2014 | Wang | H01L 21/78 438/113 |
| 2014/0091454 | A1* | 4/2014 | Lin | H01L 23/3128 257/E23.116 |
| 2018/0294202 | A1* | 10/2018 | Cheng | H01L 23/3135 |
| 2018/0350710 | A1 | 12/2018 | Iwahashi et al. | |
| 2021/0111160 | A1* | 4/2021 | Kim | H01L 23/3185 |
| 2021/0166986 | A1* | 6/2021 | Roth | H01L 23/562 |

(Continued)

FOREIGN PATENT DOCUMENTS

| | | |
|---|---|---|
| JP | H88 00354 A | 1/1996 |
| JP | H11-067998 A | 3/1999 |

(Continued)

*Primary Examiner* — Eugene Lee

(74) *Attorney, Agent, or Firm* — Foley & Lardner LLP

(57) ABSTRACT

A semiconductor device includes: a wiring substrate; at least one first semiconductor element provided above the wiring substrate; a first resin layer configured to seal the first semiconductor element; and a second resin layer provided on an outer surface of the first resin layer. A Young's modulus of the second resin layer is greater than a Young's modulus of the first resin layer, and/or a linear thermal expansion coefficient of the second resin layer is greater than a linear thermal expansion coefficient of the first resin layer.

18 Claims, 13 Drawing Sheets

(56) References Cited

U.S. PATENT DOCUMENTS

| | | | | |
|---|---|---|---|---|
| 2022/0068743 | A1* | 3/2022 | Enomoto | H01L 21/4882 |
| 2022/0102313 | A1* | 3/2022 | Jeng | H01L 25/50 |
| 2023/0035212 | A1* | 2/2023 | Chiang | H01L 21/6835 |

FOREIGN PATENT DOCUMENTS

| | | | |
|---|---|---|---|
| JP | 2013-038410 | A | 2/2013 |
| JP | 2014-103187 | A | 6/2014 |
| WO | WO-2017/138402 | A1 | 8/2017 |

* cited by examiner

FIG. 3
PROCESS (S01) OF PLACING FIRST SEMICONDUCTOR ELEMENT ON WIRING SUBSTRATE
PROCESS (S02) OF SEALING FIRST SEMICONDUCTOR ELEMENT WITH FIRST RESIN LAYER
PROCESS (S03) OF FORMING SECOND RESIN LAYER ON FIRST RESIN LAYER
PROCESS (S04) OF DIVIDING MEMBER IN WHICH SECOND RESIN LAYER IS FORMED
FIG. 4
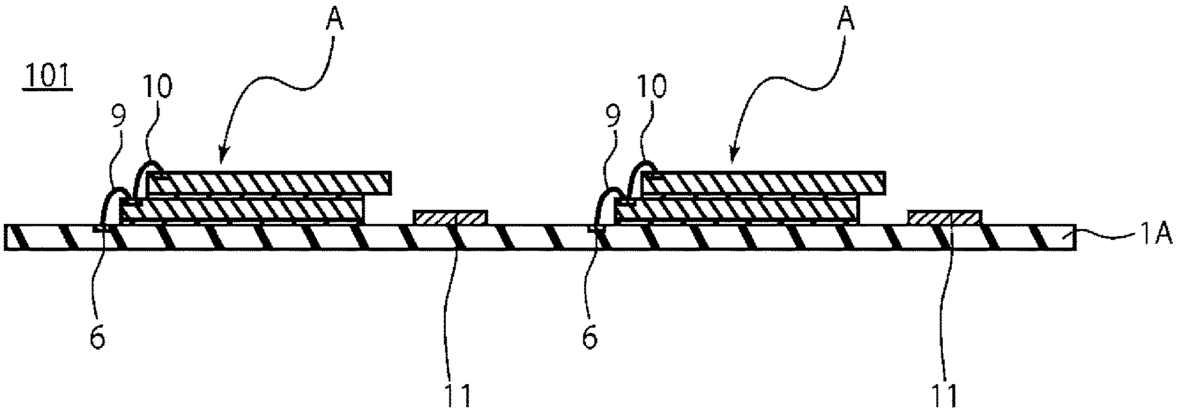
FIG. 5
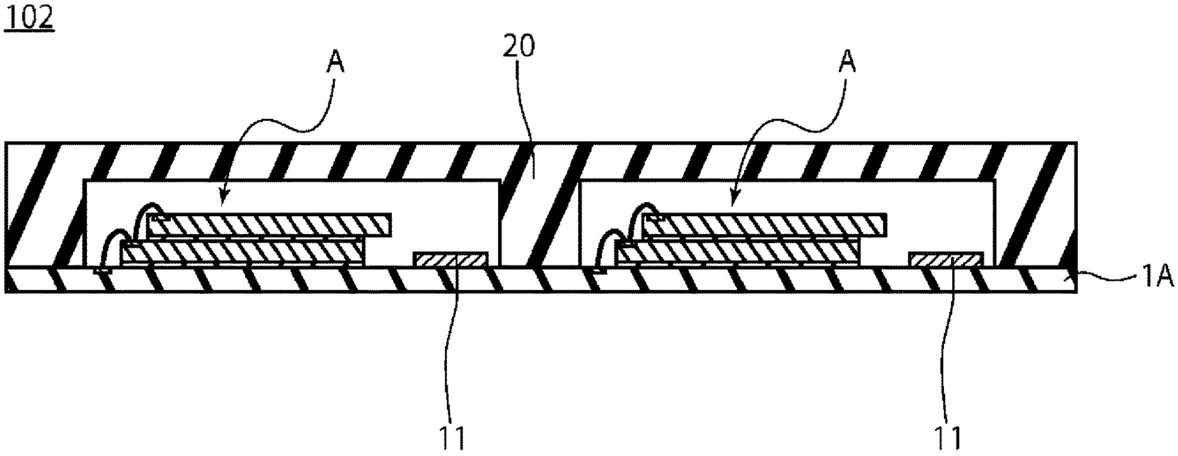

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2022-150876, filed Sep. 22, 2022, the entire contents of which are incorporated herein by reference.

FIELD

Embodiments described herein relate generally to a semiconductor device and a method of manufacturing the semiconductor device.

BACKGROUND

In packages in which NAND flash memory chips are stacked, the NAND flash memory chips on wiring substrates are sealed with sealing resins. In certain cases, deformation of the packages may be prevented using thick sealing resins.

DESCRIPTION OF THE DRAWINGS

FIG. 3 is a flowchart of a method of manufacturing the semiconductor device according to the embodiment;

FIG. 4 is a process schematic view of the method of manufacturing the semiconductor device according to the embodiment;

FIG. 5 is a process schematic view of the method of manufacturing the semiconductor device according to the embodiment;

DETAILED DESCRIPTION

Figure 1:
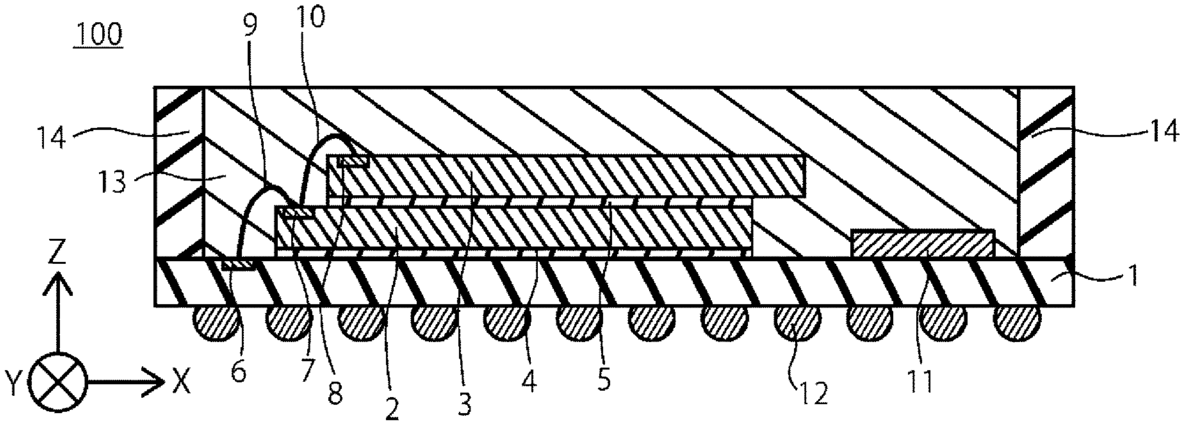
FIG. 1 is a schematic sectional view of a semiconductor device according to an embodiment.

Embodiments provide a highly reliable semiconductor device and a highly reliable method of manufacturing the semiconductor device.

In general, according to one embodiment, a semiconductor device includes: a wiring substrate; at least one first semiconductor element provided above the wiring substrate; a first resin layer configured to seal the first semiconductor element; and a second resin layer provided on an outer surface of the first resin layer. A Young's modulus of the second resin layer is greater than a Young's modulus of the first resin layer, and/or a linear thermal expansion coefficient of the second resin layer is greater than a linear thermal expansion coefficient of the first resin layer.

Hereinafter, embodiments will be described with reference to the drawings.

In the present specification, examples of a plurality of expressions of several elements are given. These expressions are merely example and different expressions of the elements are not denied. Elements to which a plurality of expressions are not given may be differently expressed.

The drawings are schematic and relationships between thicknesses and planar dimensions or ratios of thicknesses of layers may be different from actual ratios. In the drawings, portions with different relationships or ratios of dimensions are provided in some cases. In the drawings, some reference numerals are omitted.

Physical properties described in embodiments are values at the room temperature under a barometric pressure. Diameters are circumscribed circle diameters of particles.

In the present specification, processes include not only independent processes but also combinations with other processes or other treatment. When a plurality of numeral value ranges are described under numerical value conditions in the present specification, upper limits or lower limits in the numeral value ranges may be substituted with upper limits or lower limits of other numeral value ranges. When upper limits and lower limits of numerical value conditions in the present specification are described, the upper limits and the lower limits can be substituted with condition of combined numerical value ranges.

First Embodiment

Figure 2:
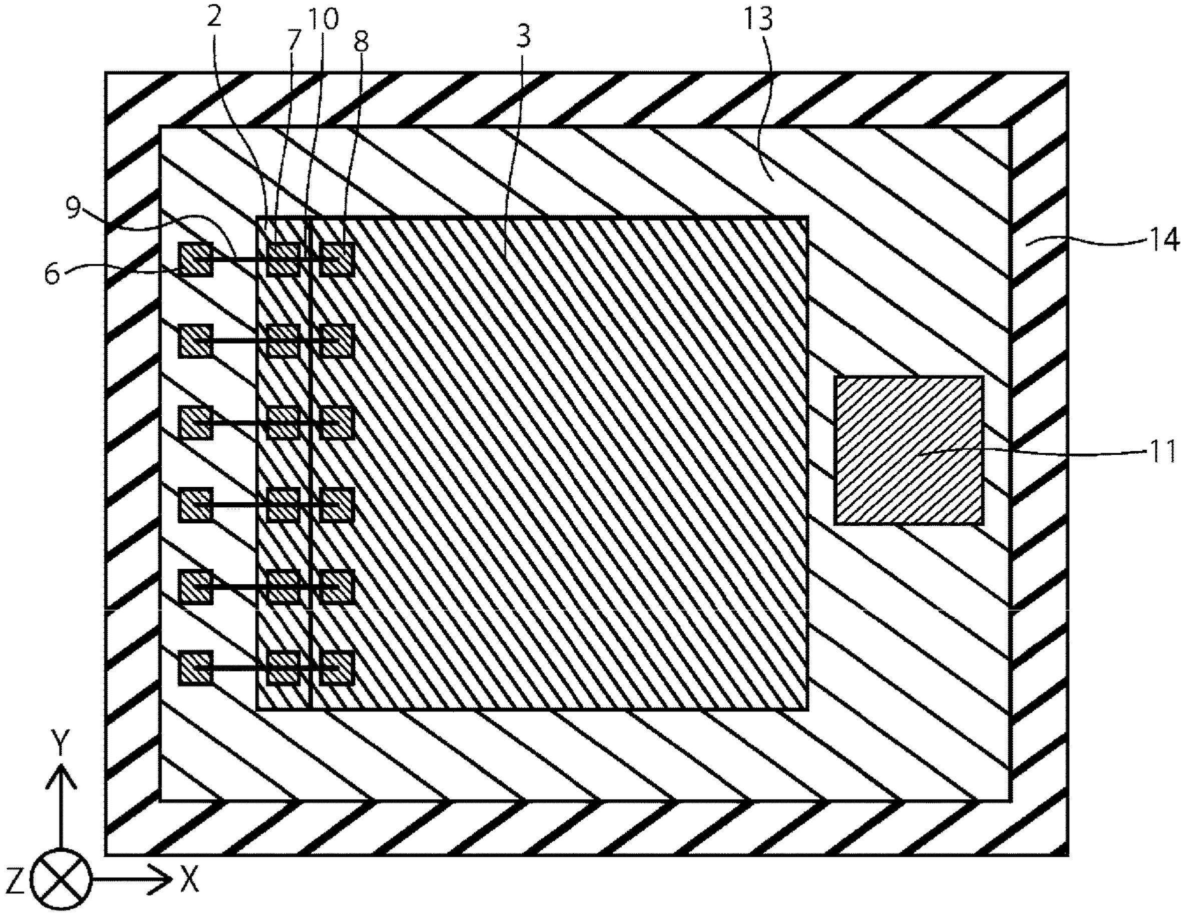
FIG. 2 is a schematic transmission top view of the semiconductor device according to the embodiment.

A first embodiment relates to a semiconductor device and a method of manufacturing the semiconductor device. FIG. 1 is a schematic sectional view of a semiconductor device 100. FIG. 2 is a schematic top view of the semiconductor device 100. The schematic top view of FIG. 2 is a diagram when the semiconductor device 100 is viewed from the upper side in the Z direction of FIG. 1. The schematic view of FIG. 2 illustrates an upper surface of the semiconductor device 100 in which a part of a first resin layer 13 is removed. The semiconductor device 100 according to the embodiment in FIG. 1 is more specifically a semiconductor package on which a NAND flash memory chip or the like is mounted. Preferably, the X, Y, and Z directions intersect each other and are orthogonal to each other.

The semiconductor device 100 is an example of a storage device. The semiconductor device 100 includes a wiring substrate 1, a first semiconductor element 2, a third semiconductor element 3, a first intermediate layer 4, a second intermediate layer 5, a pad 6, a pad 7, a pad 8, a bonding wire 9, a bonding wire 10, a second semiconductor element 11, a solder ball 12, a first resin layer 13, and a second resin layer 14.

The wiring substrate 1 is a supporting substrate for the first semiconductor element 2 or the like. More specifically, the wiring substrate 1 is a multilayer printed substrate (PCB). The wiring substrate 1 includes wirings in the pad 6 and a substrate (not illustrated). The first semiconductor element 2 and the like are provided on a first surface of the wiring substrate 1. A hemispheric electrode such as the solder ball 12 for connection with the outside of the semiconductor device 100 is provided on a second surface opposite to the first surface of the wiring substrate 1. One pad 6 is shown on the wiring substrate 1 in FIG. 1. The semiconductor device 100 may include the plurality of pads 6.

The first semiconductor element 2 is placed on the wiring substrate 1. The third semiconductor element 3 is placed on the first semiconductor element 2. The first semiconductor element 2 and the third semiconductor element 3 are, for example, semiconductor memory chips. The semiconductor memory chips are semiconductor chips capable of reading and writing data. In the embodiment, nonvolatile memory chips or volatile memory chips may be used as the semiconductor memory chips. As the nonvolatile memory chips, NAND memory chips, phase-change memory chips, resistance change memory chips, ferroelectric memory chips, magnetic memory chips, or the like may be used. As the volatile memory chips, dynamic random access memory (DRAM) or the like may be used.

The semiconductor memory chips provided in the semiconductor device 100 are preferably semiconductor chips that have the same structure including the same circuit except for individual differences. For example, the first semiconductor element 2 and the third semiconductor element 3 are semiconductor memory chips that have the same structure including the same circuit except for individual differences.

The semiconductor device 100 preferably includes two or more semiconductor memory chips. When the semiconductor device 100 includes two or more semiconductor memory chips, the plurality of semiconductor memory chips can be stacked to be shifted in the X direction (the right direction of the drawing (the +X direction) or/and the left direction of the drawing (−X direction)). When the semiconductor device 100 includes two or more semiconductor memory chips, the plurality of semiconductor memory chips can be stacked to be shifted in the Y direction (the depth direction of the drawing (the +Y direction) or/and the front direction of the drawing (−Y direction)). A semiconductor device including only one semiconductor memory chip is also provided in the embodiment.

The first semiconductor element 2 includes the pad 7. The first semiconductor element 2 is electrically connected to the wiring substrate 1 via the bonding wire 9 connecting the pad 6 to the pad 7. In FIG. 1, the number of pads 7 is one, but the plurality of pads 7 are preferably located in the Y direction.

The third semiconductor element 3 includes the pad 8. The third semiconductor element 3 is electrically connected to the first semiconductor element 2 and the wiring substrate 1 via the bonding wire 10 connecting the pad 7 to the pad 8. In FIG. 1, the number of pads 8 is one, but the plurality of pads 8 are preferably located in the Y direction.

The first semiconductor element 2 is located between the wiring substrate 1 and the third semiconductor element 3. The first semiconductor element 2 is sealed with the first resin layer 13. The bonding wire 9 connecting the first semiconductor element 2 to the wiring substrate 1 is sealed with the first resin layer 13. The others except for a surface of the first semiconductor element 2 facing the wiring substrate 1 are sealed with the first resin layer 13.

The first semiconductor element 2 is in direct contact with the first intermediate layer 4, the second intermediate layer 5, the bonding wire 9, and the first resin layer 13. The surface of the first semiconductor element 2 facing the wiring substrate 1 is in direct contact with the first intermediate layer 4. A surface of the first semiconductor element 2 opposite to the wiring substrate 1 is in direct contact with the second intermediate layer 5, the bonding wire 9, the bonding wire 10, and the first resin layer 13. The side surfaces of the first semiconductor element 2 are in direct contact with the first resin layer 13. The first semiconductor element 2 is not electrically connected to the first intermediate layer 4 which has an insulating property, the second intermediate layer 5 which has an insulating property, and the first resin layer 13 which has an insulating property.

The third semiconductor element 3 is in direct contact with the second intermediate layer 5, the bonding wire 9, the bonding wire 10, and the first resin layer 13. A surface of the third semiconductor element 3 facing the wiring substrate 1 is in direct contact with the second intermediate layer 5. A surface of the third semiconductor element 3 opposite to the wiring substrate 1 is in direct contact with the bonding wire 10 and the first resin layer 13. The side surfaces of the third semiconductor element 3 are in direct contact with the first resin layer 13. The third semiconductor element 3 is not electrically connected to the second intermediate layer 5 which has an insulating property and the first resin layer 13 which has an insulating property.

The first intermediate layer 4 is provided between the wiring substrate 1 and the first semiconductor element 2. The first intermediate layer 4 adheres the first semiconductor element 2 to the wiring substrate 1. The first intermediate layer 4 is an insulating resin layer. The first intermediate layer 4 contains, for example, an epoxy resin. The first intermediate layer 4 is, for example, a layer in which an adhesive layer of a die attach film (DAF) is cured.

The second intermediate layer 5 is provided between the first semiconductor element 2 and the third semiconductor element 3. The second intermediate layer 5 adheres the third semiconductor element 3 to the first semiconductor element 2. The second intermediate layer 5 is an insulating resin layer. The second intermediate layer 5 contains, for example, an epoxy resin. The second intermediate layer 5 is, for example, a layer in which an adhesive layer of a DAF is cured.

The second semiconductor element 11 is placed on the wiring substrate 1. The second semiconductor element 11 is a semiconductor element that has a circuit different from both the first semiconductor element 2 and the third semiconductor element 3. The second semiconductor element 11 is electrically connected to the wiring substrate 1 via a conductive adhesive (for example, a solder) or a wiring (for example, a bonding wire) (not illustrated). The second semiconductor element 11 is electrically connected to the first semiconductor element 2 and the third semiconductor element 3 via the wiring substrate 1.

When the semiconductor device 100 is a storage device, the second semiconductor element 11 is, for example, a controller chip. The controller chip is a semiconductor chip controlling reading, wiring, erasing, and the like of the semiconductor memory chip.

The solder ball 12 is an external connection terminal electrically connected to the outside of the semiconductor device 100. When the semiconductor device 100 is a ball grid array (BGA) package, the plurality of solder balls 12 are provided in the semiconductor device 100. In accordance with a package form of the semiconductor device, a member suitable for an external connection terminal is selected.

The first resin layer 13 includes a first resin and a first filler. The first resin layer 13 has an insulating property. The first resin layer 13 is provided on the wiring substrate 1 and seals the first semiconductor element 2. The first resin layer 13 illustrated in the schematic view of FIG. 1 seals the first semiconductor element 2, the second semiconductor element 11, and the third semiconductor element 3. The first resin layer 13 is a resin composition in which a mixture including the first resin and the first filler is cured with heat, ultraviolet light, or the like.

The first resin includes preferably one or more resins selected from a group configured with an epoxy-based resin, a phenol-based resin, a polyimide-based resin, a polyamide-based resin, an acrylic-based resin, a polybenzoxazole-based resin, a silicon-based resin, and a benzocyclobutene-based resin. Examples of the epoxy-based resin are not particularly limited and include bisphenol epoxy resins such as a bisphenol A type, a bisphenol F type, a bisphenol AD type, and a bisphenol S type, a novolak-based epoxy resin such as a phenol novolak type or a cresol novolak type, an aromatic epoxy resin such as a resorcinol type epoxy resin or tris phenol methane triglycidyl ether, a naphthalene type epoxy resin, a fluorene type epoxy resin, a dicyclopentadiene type epoxy resin, a polyether modified epoxy resin, a benzophenone type epoxy resin, an aniline type epoxy resin, an NBR modified epoxy resin, a CTBN modified epoxy resin, and hydrogenated products thereof. Of them, a naphthalene type epoxy resin or a dicyclopentadiene type epoxy resin is preferable in terms of good adhesion with Si. A benzophenone type epoxy resin is also preferable in terms of fast curability which may be obtained easily. Such an epoxy resin may be used singly or may be used together with two or more types.

The first filler provided in the first resin layer 13 is preferably an inorganic oxide particle such as silica or/and alumina. An average primary diameter of the first filler is preferably 1 [μm] or more and 80 [μm] or less in consideration that a narrow region is also filled with the first resin layer 13, and damage is not to occur in the bonding wire 9 and the bonding wire 10.

The second resin layer 14 includes a second resin and a second filler. The second resin layer 14 has a conductive property or an insulating property. The second resin layer 14 is provided on the outer surface of the first resin layer 13. An inner surface of the second resin layer 14 is in contact with the outside surface of the first resin layer 13. The inner surface of the second resin layer 14 is preferably in direct contact with the outer surface of the first resin layer 13. The second resin layer 14 is provided on a part of the outer surface of the first resin layer 13 or is provided on the entire outer surface of the first resin layer 13. The second resin layer 14 illustrated in the schematic view of FIG. 2 covers the outside surface of the first resin layer 13 on the whole. The second resin layer 14 is a resin composition in which a mixture including the second resin and the second filler is cured with heat, ultraviolet light, or the like.

Of the surfaces of the first resin layer 13, a surface facing the first semiconductor element 2 side is an inner surface and a surface facing the outside is an outer surface. Of the outer surfaces of the first resin layer 13, a surface facing the wiring substrate 1 is a lower outer surface, a surface facing the surface opposite to the wiring substrate 1 side is an upper outer surface, and a surface excluding the lower surface and the upper surface is an outside surface.

The second resin includes preferably one or more resins selected from a group configured with an epoxy-based resin, a phenol-based resin, a polyimide-based resin, a polyamide-based resin, an acrylic-based resin, a polybenzoxazole-based resin, a silicon-based resin, and a benzocyclobutene-based resin. Examples of the epoxy-based resin are not particularly limited and include bisphenol epoxy resins such as a bisphenol A type, a bisphenol F type, a bisphenol AD type, and a bisphenol S type, a novolak-based epoxy resin such as a phenol novolak type or a cresol novolak type, an aromatic epoxy resin such as a resorcinol type epoxy resin or tris phenol methane triglycidyl ether, a naphthalene type epoxy resin, a fluorene type epoxy resin, a dicyclopentadiene type epoxy resin, a polyether modified epoxy resin, a benzophenone type epoxy resin, an aniline type epoxy resin, an NBR modified epoxy resin, a CTBN modified epoxy resin, and hydrogenated products thereof. Of them, a naphthalene type epoxy resin or a dicyclopentadiene type epoxy resin is preferable in terms of good adhesion with Si. A benzophenone type epoxy resin is also preferable in terms of fast curability which may be obtained easily. Such an epoxy resin may be used singly or may be used together with two or more types.

The second filler provided in the second resin layer 14 is preferably one or more types selected from a group configured with an inorganic oxide particle such as silica particle and an alumina particle and metal particle. The second resin layer 14 is not a member that seals a semiconductor element or a wiring in the semiconductor device 100 but a member used to enhance strength of the semiconductor device 100. An average primary diameter of the second filler is preferably 10 [μm] or more and 100 [μm] or less from the viewpoint of enhancing the strength of the semiconductor device 100.

The second resin layer 14 contains a fiber in addition to a granular filler in some cases. As the fiber provided in the second resin layer 14, for example, a glass fiber or/and a carbon fiber is preferable. Such a fiber may adjust the strength of the second resin layer 14.

When the second resin layer 14 contains a metal particle and/or a carbon fiber, the second resin layer 14 has a conductive property in some cases.

Between the first resin layer 13 and the second resin layer 14, there is preferably an interface.

A Young's modulus [Pa] of the first resin layer 13 in a range of 20 [ ° C.] or more and 150 [ ° C.] or less is referred to as a first Young's modulus [Pa]. For the Young's modulus, if there is no restriction on temperature, physical properties in the whole temperature range from 20 [ ° C.] to 150 [ ° C.] are indicated. A linear thermal expansion coefficient [/K] of the first resin layer 13 is referred to as a first linear thermal expansion coefficient. A Young's modulus [Pa] of the second resin layer 14 in a range of 20 [ ° C.] or more and 150 [ ° C.] or less is referred to as a second Young's modulus [Pa]. A linear thermal expansion coefficient [/K] of the second resin layer 14 is referred to as a second linear thermal expansion coefficient.

From the viewpoint of preventing deformation of the semiconductor device 100, at least one of "the second Young's modulus that is greater than the first Young's modulus" and "the second linear thermal expansion coefficient that is greater than the first linear thermal expansion coefficient" is used.

When the second resin layer 14 is provided on the outer surface of the first resin layer 13 and a relationship of at least one of the foregoing Young's modulus and the linear thermal expansion coefficient is satisfied, it is possible to prevent deformation of the semiconductor device 100.

Bending rigidity for preventing deformation of the semiconductor device 100 is related to [elastic modulus (Young's modulus)]×[sectional second moment]. The sectional second moment is greater as a distance from the bending neutral axis of the semiconductor device 100 is more distant. The bending neutral axis of the semiconductor device 100 is located on a middle side of the semiconductor device 100. In order to reduce an increase in the thickness of the semiconductor device 100 and enhance the bending rigidity of the semiconductor device 100, the second resin layer 14 is preferably provided on the outside surface of the first resin layer 13. Since the bending neutral axis of the semiconductor device 100 is located near the first semiconductor element 2, the second resin layer 14 is preferably not in direct contact with the first semiconductor element 2.

From the viewpoint of enhancing the bending rigidity of the semiconductor device 100, the second resin layer 14 is preferably provided in 50% or more and 100% or less of an area of the outside surface of the first resin layer 13, the second resin layer 14 is more preferably provided in 75% or more and 100% or less of the area of the outside surface of the first resin layer 13, and the second resin layer 14 is even more preferably provided in the entire area (100%) of the outside surface of the first resin layer 13.

From the viewpoint of preventing deformation of the semiconductor device 100, the second Young's modulus at 20 [ ° C.] is preferably 1.1 times or more and 3 times or less of the first Young's modulus at 20 [ ° C.] and is more preferably 3 times or more and 5 times or less of the first Young's modulus. The second Young's modulus at 50 [ ° C.] is preferably 1.1 times or more and 3 times or less of the first Young's modulus at 50 [ ° C.] and is more preferably 3 times or more and 5 times or less of the first Young's modulus. The second Young's modulus at 100 [ ° C.] is preferably 1.1 times or more and 3 times or less of the first Young's modulus at 100 [ ° C.] and is more preferably 3 times or more and 5 times or less of the first Young's modulus. The second Young's modulus at 150 [ ° C.] is preferably 1.1 times or more and 3 times or less of the first Young's modulus at 150 [ ° C.] and is more preferably 3 times or more and 5 times or less of the first Young's modulus.

From the viewpoint of enhancing the bending rigidity of the semiconductor device 100, the second Young's modulus is preferably 30 [GPa] or more and 100 [Pa] or less.

A difference between the second and first linear thermal expansion coefficients ([second linear thermal expansion coefficient]−[first linear thermal expansion coefficient]) is preferably $1\times10^{-6}$ [/K] or more and $10\times10^{-6}$ [/K] or less and more preferably $10\times10^{-6}$ [/K] or more and $20\times10^{-6}$ [/K] or less. Since there is a difference in the linear thermal expansion coefficient, it is easy to prevent deformation of the semiconductor device 100.

Preferably, the first and second linear thermal expansion coefficients are reversely positive or negative. Preferably, the first linear thermal expansion coefficient is less than 0 [/K] and the second linear thermal expansion coefficient is greater than 0 [/K]. When the linear thermal expansion coefficients of the first resin layer 13 and the second resin layer 14 are reversely positive or negative, the thermal expansion of one member can be alleviated by the other member.

By adjusting a type of the first resin, a type of the first filler, the size of the first filler, and a ratio of the first resin to the first filler, the Young's modulus and the linear thermal expansion coefficient of the first resin layer 13 are adjusted.

By adjusting a type of the second resin, a type of the second filler, the size of the second filler, and a ratio of the second resin to the second filler, the Young's modulus and the linear thermal expansion coefficient of the second resin layer 14 are adjusted.

Preferably, the second Young's modulus is greater than the first Young's modulus and the second linear thermal expansion coefficient is greater than the first linear thermal expansion coefficient. More preferably, the second Young's modulus at each of 50 [° C.], 100 [° C.], and 150 [ ° C.] is 1.1 times or more and 3 times or less the first Young's modulus at each of 50 [° C.], 100 [° C.], and 150 [ ° C.] and the difference between the second and first linear thermal expansion coefficients is $1\times10^{-6}$ [/K] or more and $10\times10^{-6}$ [/K] or less. Even more preferably, the second Young's modulus at each of 50 [° C.], 100 [° C.], and 150 [ ° C.] is 3 times or more and 5 times or less of the first Young's modulus at each of 50 [° C.], 100 [° C.], and 150 [ ° C.] and the difference between the second and first linear thermal expansion coefficients is $10\times10^{-6}$ [/K] or more and $20\times10^{-6}$ [/K] or less.

In the semiconductor device 100, an outer peripheral portion is easily deformed to be warped in the Z direction (the upper side of the drawing). From the viewpoint of preventing deformation of the semiconductor device 100, for example, there is a scheme of causing the thickness of the first resin layer 13 to be thick. However, when the thickness of the first resin layer 13 is caused to be thick, the thickness of the semiconductor device 100 becomes thick. When the thin semiconductor device 100 is desired to be obtained and the semiconductor device 100 is sealed with only the first resin layer 13, the semiconductor device 100 is easily deformed. The second resin layer 14 is a member with high strength. Therefore, by using the first resin layer 13 and the second resin layer 14 together, it is possible to enhance the strength of the semiconductor device 100.

From the viewpoint of enhancing bending rigidity of the semiconductor device 100, the thickness of the second resin layer 14 (the thickness in the X or Y direction) provided on the outside surface of the first resin layer 13 is preferably 10 [μm] or more and 100 [μm] or less.

From the viewpoint of enhancing the strength of the second resin layer 14, a filling rate of the second filler of the second resin layer 14 is preferably 50 [Vol %] or more and 95 [Vol %] or less. When the second filler of the second resin layer 14 is biased, it is not preferable from the viewpoint of enhancing the bending rigidity of the semiconductor device 100. A difference between a maximum value and a minimum value of the filling rate of the second filler is preferably 0 [Vol %] or more and 30 [Vol %] or less.

The Young's modulus [Pa] of the wiring substrate 1 in a range of 20 [ ° C.] or more and 150 [ ° C.] or less is referred to as a third Young's modulus [Pa]. From the viewpoint of preventing deformation of the semiconductor device 100, it is preferable that the first, second, and third Young's moduli satisfy a relationship of the first Young's modulus<the third Young's modulus<the second Young's modulus.

A linear thermal expansion coefficient [/K] of the wiring substrate 1 is referred to as a third linear thermal expansion coefficient. From the viewpoint of preventing deformation of the semiconductor device 100, the first, second, and third linear thermal expansion coefficients satisfy a relationship of the first linear thermal expansion coefficient<the third linear thermal expansion coefficient<the second linear thermal expansion coefficient.

When the two relationships of the Young moduli and the linear thermal expansion coefficients are satisfied, the second resin layer 14 contributes to enhancement of bending rigidity of the semiconductor device 100 even in a high-temperature operation. When only one of the Young's modulus relationship or the linear thermal expansion coefficient relationship is satisfied, the semiconductor device is hardly deformed at a low temperature and the semiconductor device may be easily deformed at a high temperature. When the semiconductor device 100 is a storage device, the temperature is raised during an operation of the semiconductor device 100 and the temperature is lowered during stop of the operation. Since the semiconductor device 100 according to the embodiment is hardly deformed during a fluctuation of the temperature, stress is hardly applied to a substrate connected to the semiconductor device 100 or joining portions of the solder balls 12 of the semiconductor device 100. Accordingly, the semiconductor device 100 contributes to an improvement of reliability.

When the semiconductor device 100 is a storage device, the thickness of the semiconductor device 100 tends to become thick due to an increase in the thickness of the memory chip and/or an increase in the number of stacked memory chips according to an increase in capacity of the storage device. The amount of heat generation increases with an increase in an operation speed of the storage device. When the height of the semiconductor device 100 is increased, the area of the semiconductor device 100 is increased, or the amount of heat generation is increased, an influence of deformation of the semiconductor device 100 is increased. The configuration according to the embodiment is a preferred form for easily preventing the deformation when the semiconductor device 100 is a storage device.

Next, methods of manufacturing the semiconductor device 100 will be described. Several methods of manufacturing the semiconductor device 100 are exemplified in the specification. For example, other methods may be adopted as a method of forming the first resin layer 13 and a method of forming the second resin layer 14. FIG. 3A illustrates flowchart of a method of manufacturing the semiconductor device 100. FIGS. 4 to 10 are schematic process sectional views of the semiconductor device 100. In the views illustrating the processes, reference numerals of some members are omitted.

The method of manufacturing the semiconductor device 100 includes a process (S01) of placing the first semiconductor element 2 on the wiring substrate LA, a process (S02) of sealing the first semiconductor element 2 with the first resin layer 13, a process (S03) of forming the second resin layer 14 on the first resin layer 13, and a process (S04) of dividing a member in which the second resin layer 14 is formed.

The process (S01) of placing the first semiconductor element 2 on the wiring substrate LA will be described with reference to the process schematic view of FIG. 4. The wiring substrate 1A is a member which is the wiring substrate 1 of the semiconductor device 100 when the member is divided. The first intermediate layer 4, the first semiconductor element 2, the second intermediate layer 5, and the third semiconductor element 3 are stacked on the wiring substrate 1A. The second semiconductor element 11 is placed on the wiring substrate 1A. The bonding wire 9 connecting the pad 6 on the wiring substrate 1A to the pad 7 of the first semiconductor element 2 is formed. The bonding wire 10 connecting the pad 7 of first semiconductor element 2 to the pad 8 of the third semiconductor element 3 is formed. The second semiconductor element 11 is placed on the wiring substrate 1A. By placing the first semiconductor element 2 and the like on the wiring substrate 1A, it is possible to obtain a member 101 illustrated in the process schematic view of FIG. 4. A member in which the bonding wires 9 and 10 are formed on a stacked body of the first intermediate layer 4, the first semiconductor element 2, the second intermediate layer 5, and the third semiconductor element 3 is referred to as a stacked member A. In the member 101 illustrated in FIG. 4, two stacked members A are provided on the wiring substrate 1A.

Figure 6:
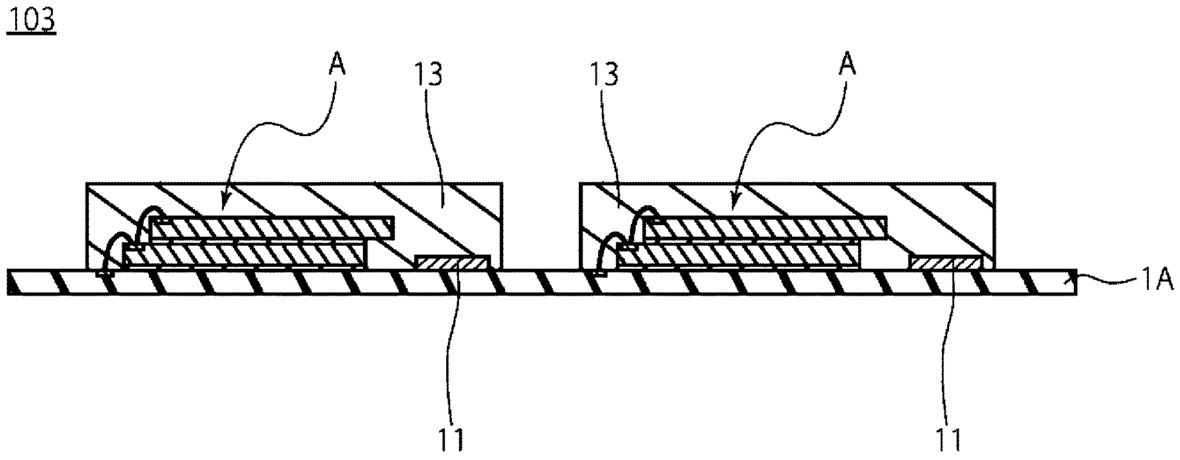
FIG. 6 is a process schematic view of the method of manufacturing the semiconductor device according to the embodiment.

The process (S02) of sealing the first semiconductor element 2 with the first resin layer 13 will be described with reference to the process schematic views of FIGS. 5 and 6. In the process (S02) of sealing the first semiconductor element 2 with the first resin layer 13 according to the first embodiment, injection molding is adopted. In a member 102 illustrated in the process schematic view of FIG. 5, a first mold 20 is placed on the member 101. When a precursor of the first resin layer 13 is injected and cured in the first mold 20 of the member 102 in FIG. 5 and the first mold 20 is detached, a member 103 in which the first semiconductor element 2 is sealed with the first resin layer 13 illustrated in FIG. 6 is obtained. In the curing of the precursor of the first resin layer 13, heating or UV irradiation is adopted.

Figure 7:
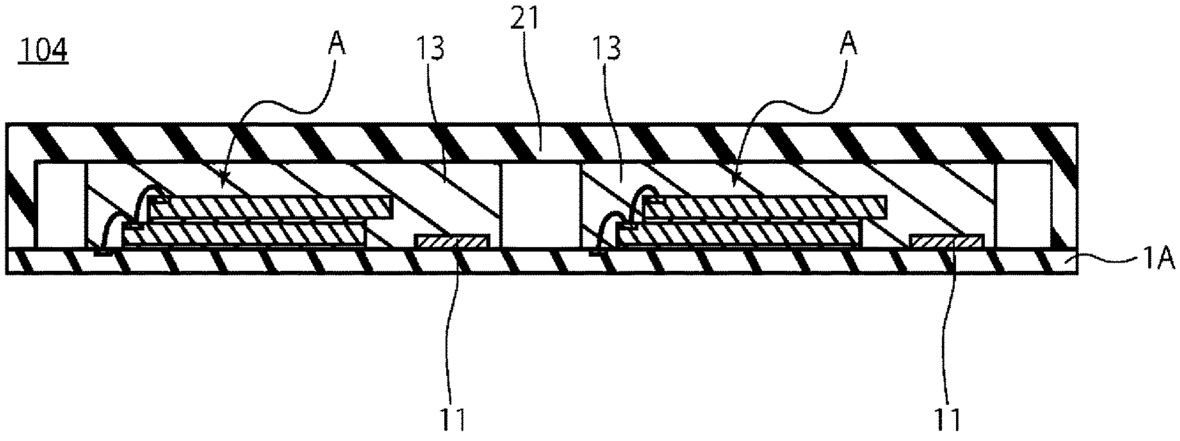
FIG. 7 is a process schematic view of the method of manufacturing the semiconductor device according to the embodiment.
Figure 8:
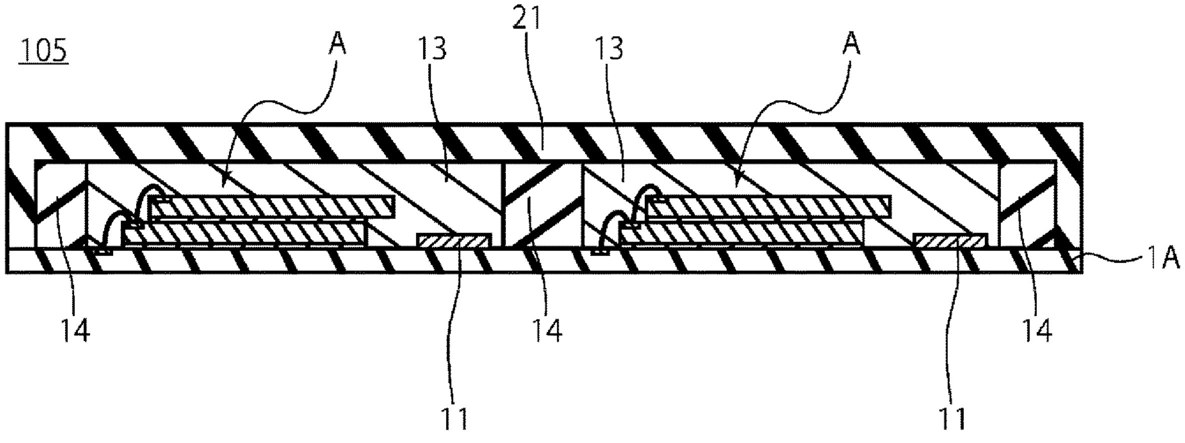
FIG. 8 is a process schematic view of the method of manufacturing the semiconductor device according to the embodiment.

The process (S03) of forming the second resin layer 14 on the first resin layer 13 will be described with reference to the process schematic views of FIGS. 7 and 8. In the process (S03) of forming the second resin layer 14 on the first resin layer 13 according to the first embodiment, injection molding is adopted. In a member 104 illustrated in the process schematic view of FIG. 7, a second mold 21 is placed on the member 103. By injecting and curing a precursor of the second resin layer 14 between the second mold 21 and the first resin layer 13, a member 105 in which the second resin layer 14 is formed is obtained. Since the second resin layer 14 is formed between the second mold 21 and the first resin layer 13, the second resin layer 14 is formed on the first resin layer 13. In the curing of the precursor of the second resin layer 14, heating or UV irradiation is adopted.

Figure 9:
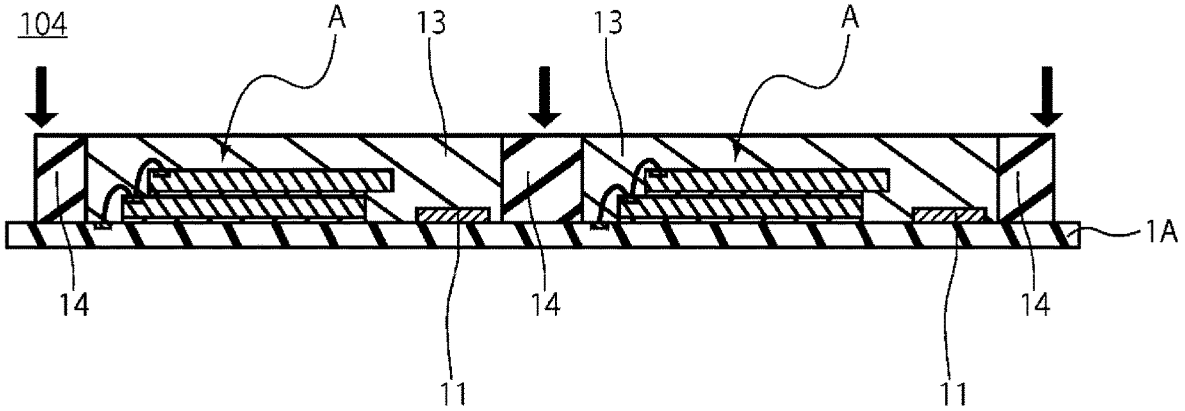
FIG. 9 is a process schematic view of the method of manufacturing the semiconductor device according to the embodiment.
Figure 10:
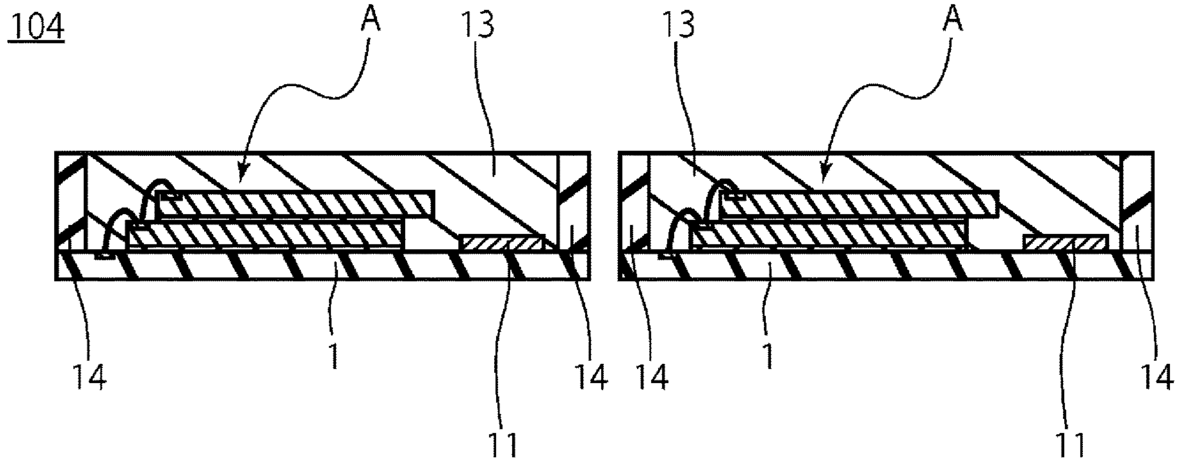
FIG. 10 is a process schematic view of the method of manufacturing the semiconductor device according to the embodiment.

The process (S04) of dividing a member in which the second resin layer 14 is formed will be described with reference to the process schematic views of FIGS. 9 and 10. A member 106 illustrated in the process schematic view of FIG. 9 is a member in which the second mold 21 is detached from the member 105. In the member 106 of FIG. 9, portions on which dicing is performed are indicated by arrows. When the second resin layer 14 is cut in the portions indicated by the arrows, a divided member 107 illustrated in the process schematic view of FIG. 10 is obtained. The member 106 can be divided by blade dicing, laser dicing, or the like. For example, by forming solder balls 12 in the divided member 107, the semiconductor device 100 is obtained.

The method of manufacturing the semiconductor device 100 according to the first embodiment is a manufacturing method of obtaining two semiconductor devices 100. Many semiconductor devices 100 can be obtained by placing the stacked member A on the wiring substrate 1A in the X direction and/or the Y direction.

Second Embodiment

Figure 11:
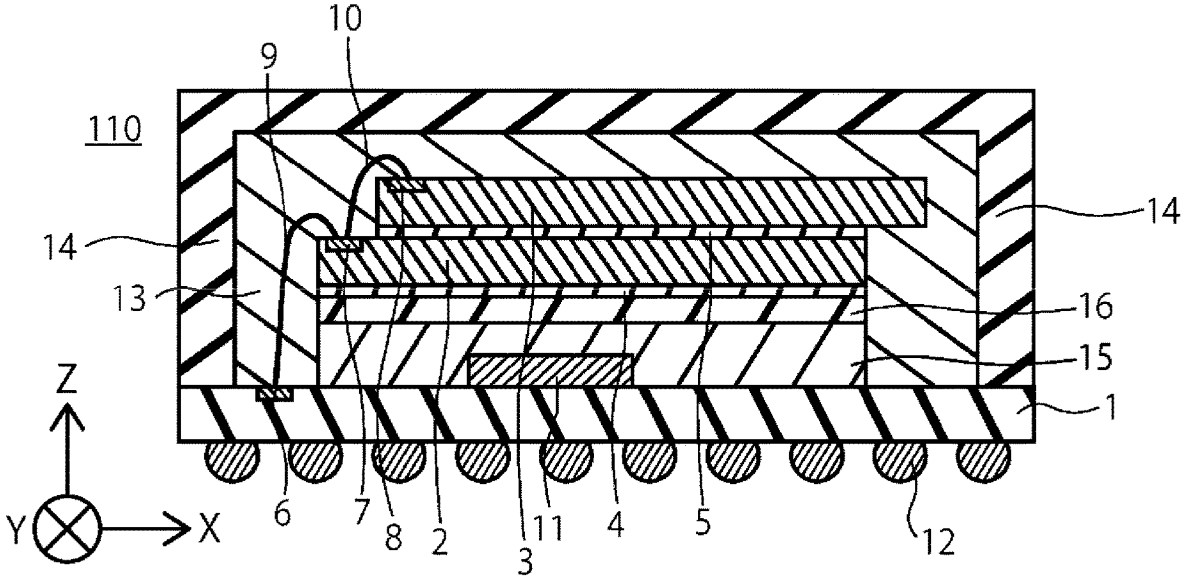
FIG. 11 is a schematic sectional view of the semiconductor device according to the embodiment.
Figure 12:
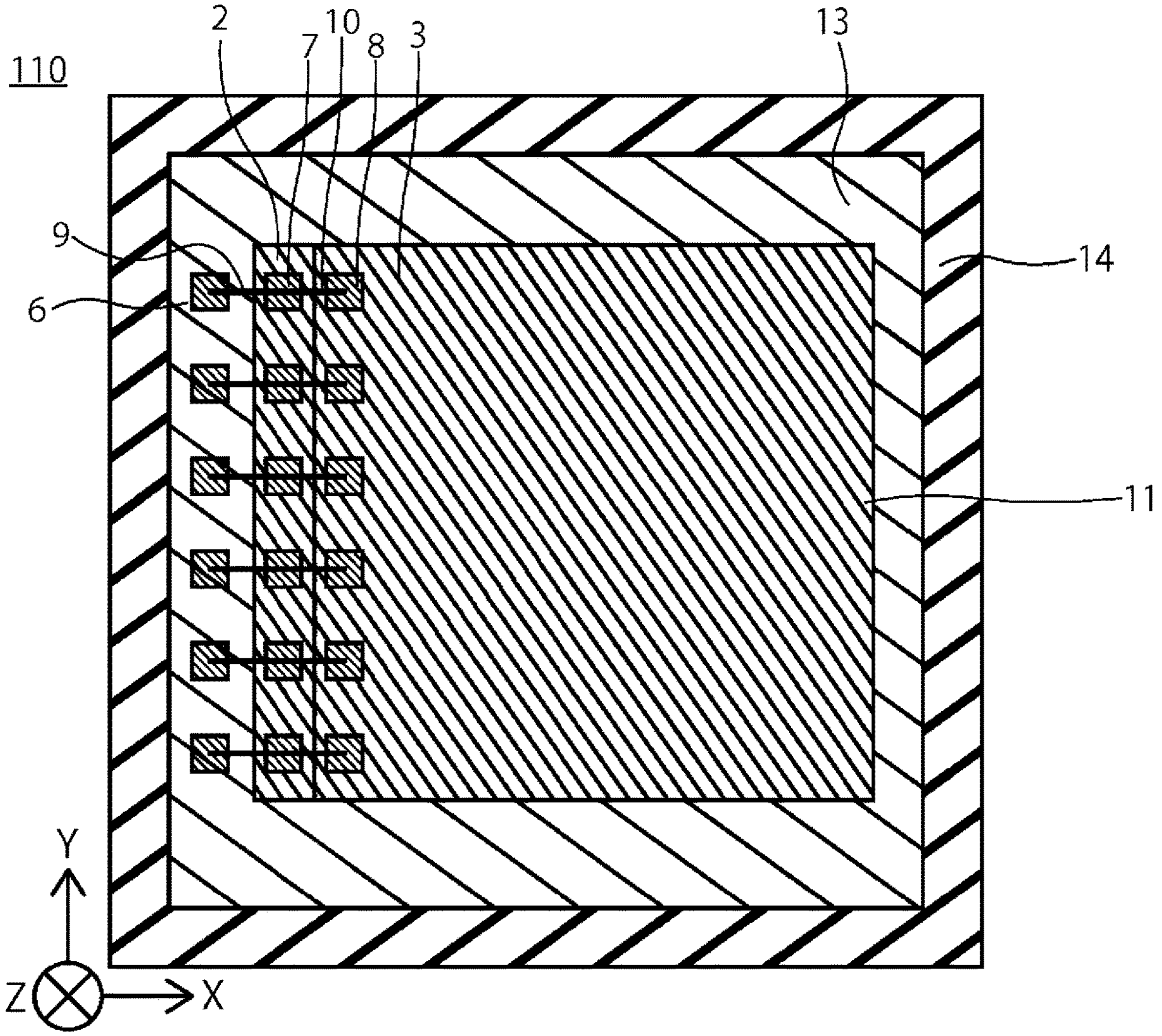
FIG. 12 is a schematic transmission top view of the semiconductor device according to an embodiment.

A second embodiment relates to a semiconductor device and a method of manufacturing the semiconductor device. FIG. 11 is a schematic sectional view of the semiconductor device 110. FIG. 12 is a schematic top view of the semiconductor device 110. The schematic top view of FIG. 12 is a diagram when the semiconductor device 110 is viewed from the upper side in the Z direction of FIG. 11. The schematic view of FIG. 12 illustrates an upper surface of the semiconductor device 110 in which a part of the first resin layer 13 is removed. The semiconductor device 110 according to the second embodiment is a modification of the semiconductor device 100 according to the first embodiment. Common content between the first and second embodiments will not be described.

In the semiconductor device 110 according to the second embodiment, the first semiconductor element 2 and the second semiconductor element 11 are not arrayed in the X direction and are stacked in the Z direction. The second semiconductor element 11 is sealed with a third resin layer 15. A plate-shaped member 16 is provided between the third resin layer 15 and the first intermediate layer 4.

When the second resin layer 14 has a conductive property, it is preferable to provide the second resin layer 14 on the upper surface of the semiconductor device 110. When the second resin layer 14 has a conductive property and the second resin layer 14 is connected to a terminal (for example, Vss) with a grounding potential of the wiring substrate 1, electromagnetic noise can be inhibited.

The third resin layer 15 is an insulating layer that contains a resin. The third resin layer 15 is, for example, a member in which an adhesive layer of DAF is cured. The third resin layer 15 is, for example, an insulating layer that includes a third resin and a third filler.

The third resin includes preferably one or more resins selected from a group configured with an epoxy-based resin, a phenol-based resin, a polyimide-based resin, a polyamide-based resin, an acrylic-based resin, a polybenzoxazole-based resin, a silicon-based resin, and a benzocyclobutene-based resin. Examples of the epoxy-based resin are not particularly limited and include bisphenol epoxy resins such as a bisphenol A type, a bisphenol F type, a bisphenol AD type, and a bisphenol S type, a novolak-based epoxy resin such as a phenol novolak type or a cresol novolak type, an aromatic epoxy resin such as a resorcinol type epoxy resin or tris phenol methane triglycidyl ether, a naphthalene type epoxy resin, a fluorene type epoxy resin, a dicyclopentadiene type epoxy resin, a polyether modified epoxy resin, a benzophenone type epoxy resin, an aniline type epoxy resin, an NBR modified epoxy resin, a CTBN modified epoxy resin, and hydrogenated products thereof. Of them, a naphthalene type epoxy resin or a dicyclopentadiene type epoxy resin is preferable in terms of good adhesion with Si. A benzophenone type epoxy resin is also preferable in terms of fast curability which may be obtained easily. Such an epoxy resin may be used singly or may be used together with two or more types.

The third filler provided in the third resin layer 15 is preferably silica or/and alumina. The third resin layer 15 is a member that seals the second semiconductor element 11 or wirings in the semiconductor device 110. In consideration of a filling property, an average primary diameter of the third filler is preferably 1 [μm] or more and 80 [μm] or less.

The plate-shaped member 16 is a member that has high flatness and is preferably a flat surface on which the first semiconductor element 2 is placed. The plate-shaped member 16 is, for example, a Si plate or an insulating resin plate. In the semiconductor device 110 of FIG. 11, the first semiconductor element 2 is placed on the wiring substrate 1 with the plate-shaped member 16 or the like interposed therebetween. For example, when the flatness of the third resin layer 15 is high, the plate-shaped member 16 may be omitted.

In the semiconductor device 110, the second resin layer 14 is also provided on the upper outer surface of the first resin layer 13. The first resin layer 13 is sealed with the second resin layer 14. By providing the second resin layer 14 on the upper surface side of the first resin layer 13, the bending rigidity of the semiconductor device 110 is further enhanced. When the second resin layer 14 is provided on the upper outer surface of the first resin layer 13 and is not provided on the outside surface, strength reinforcement of a side surface side on which there is a large influence on deformation of the semiconductor device 110 is not sufficient and it is difficult to enhance the strength while reducing the thickness of the semiconductor device 110. Accordingly, it is preferable to provide at least the second resin layer 14 on the outside surface of the first resin layer 13.

Next, a method of manufacturing the semiconductor device 110 will be described. A flowchart of the method of manufacturing the semiconductor device 110 is common to the flowchart of the method of manufacturing the semiconductor device 100. FIGS. 13 to 18 illustrate schematic process sectional views of the semiconductor device 110. In the views illustrating the processes, reference numerals of some members are omitted.

Figure 13:
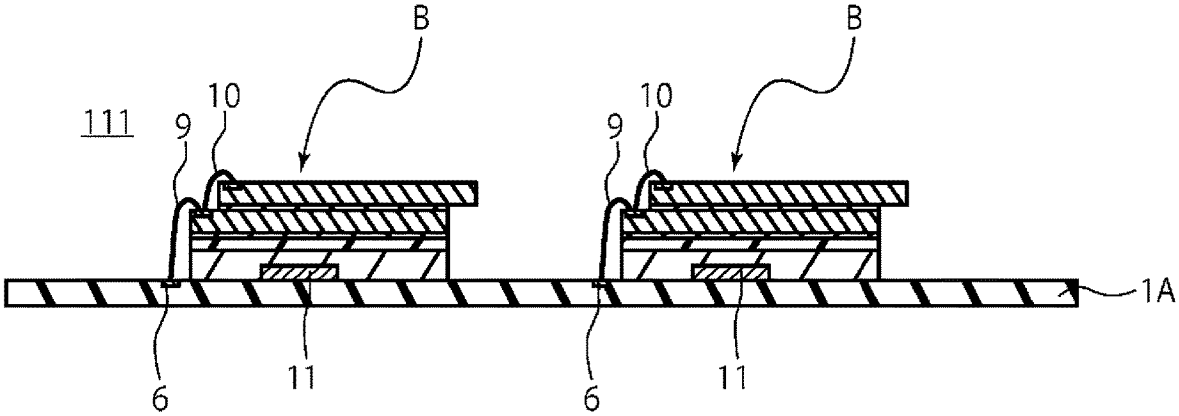
FIG. 13 is a process schematic view of a method of manufacturing the semiconductor device according to the embodiment.

The process (S01) of placing the first semiconductor element 2 on the wiring substrate 1A will be described with reference to the process schematic view of FIG. 13. The second semiconductor element 11 is sealed with the third resin layer 15 using a member in which the second semiconductor element 11 is placed on the wiring substrate 1A and then the third resin layer 15 and the plate-shaped member 16 are stacked before curing. The first intermediate layer 4, the first semiconductor element 2, the second intermediate layer 5, and the third semiconductor element 3 are stacked on the plate-shaped member 16. The bonding wire 9 connecting the pad 6 on the wiring substrate 1A to the pad 7 of the first semiconductor element 2 is formed. The bonding wire 10 connecting the pad 7 of first semiconductor element 2 to the pad 8 of the third semiconductor element 3 is formed. A member 111 illustrated in the process schematic view of FIG. 13 is obtained. A member in which the bonding wires 9 and 10 are formed on a stacked body of the first intermediate layer 4, the first semiconductor element 2, the second intermediate layer 5, and the third semiconductor element 3 is referred to as a stacked member B. In the member 111 illustrated in FIG. 13, two stacked members B are provided on the wiring substrate 1A.

Figure 14:
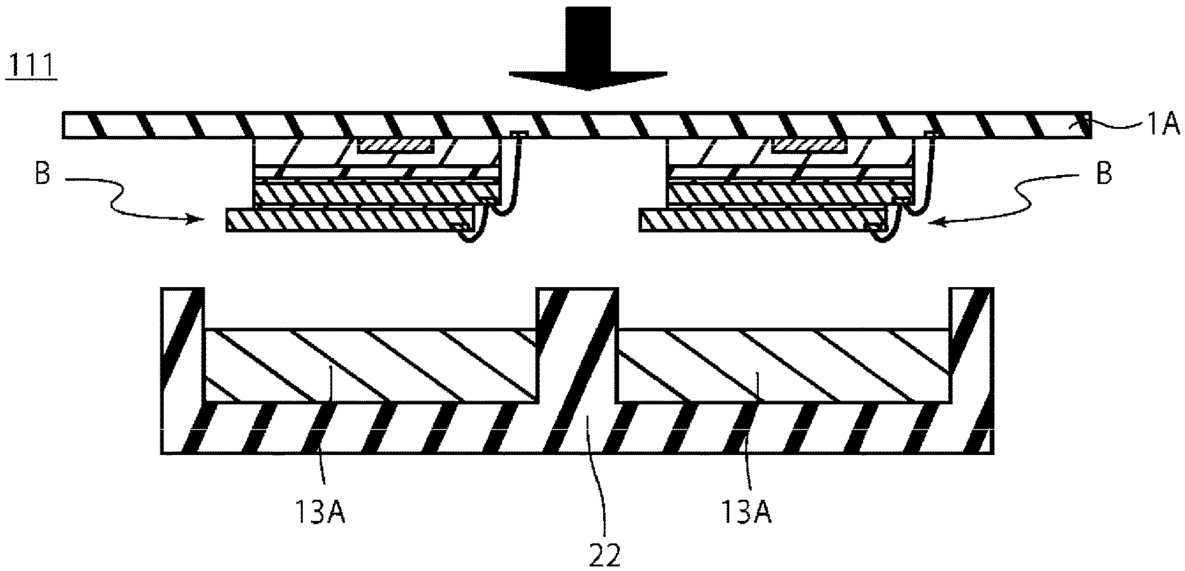
FIG. 14 is a process schematic view of the method of manufacturing the semiconductor device according to the embodiment.
Figure 15:
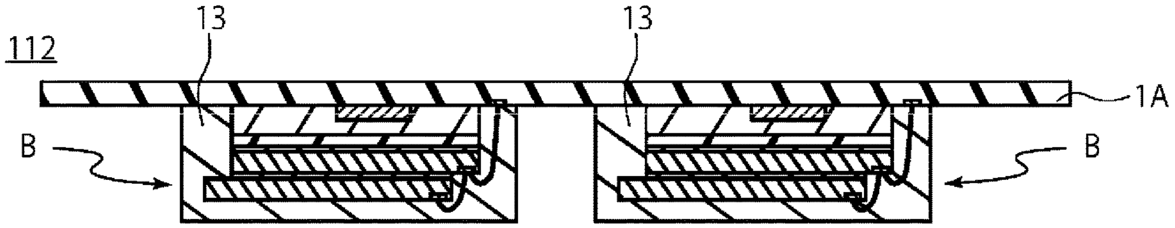
FIG. 15 is a process schematic view of the method of manufacturing the semiconductor device according to the embodiment.

The process (S02) of sealing the first semiconductor element 2 with the first resin layer 13 will be described with reference to the process schematic views of FIGS. 14 and 15. In the process (S02) of sealing the first semiconductor element 2 with the first resin layer 13 according to the second embodiment, compression molding is adopted. The member 111 illustrated in the process schematic view of FIG. 14 faces a third mold 22. A precursor 13A is in the third mold 22. The precursor 13A is a resin composition before the first resin layer 13 is cured. The member 111 is pressed against the third mold 22 in a direction indicated by an arrow of FIG. 14 and a space between the third mold 22 and the member 111 is filled with the precursor 13A in conformity with the shape of the third mold 22. The precursor 13A is cured to obtain a member 112 illustrated in FIG. 15. The stacked member B including the first semiconductor element 2, the second semiconductor element 11, and the third semiconductor element 3 is sealed with the first resin layer 13.

Figure 16:
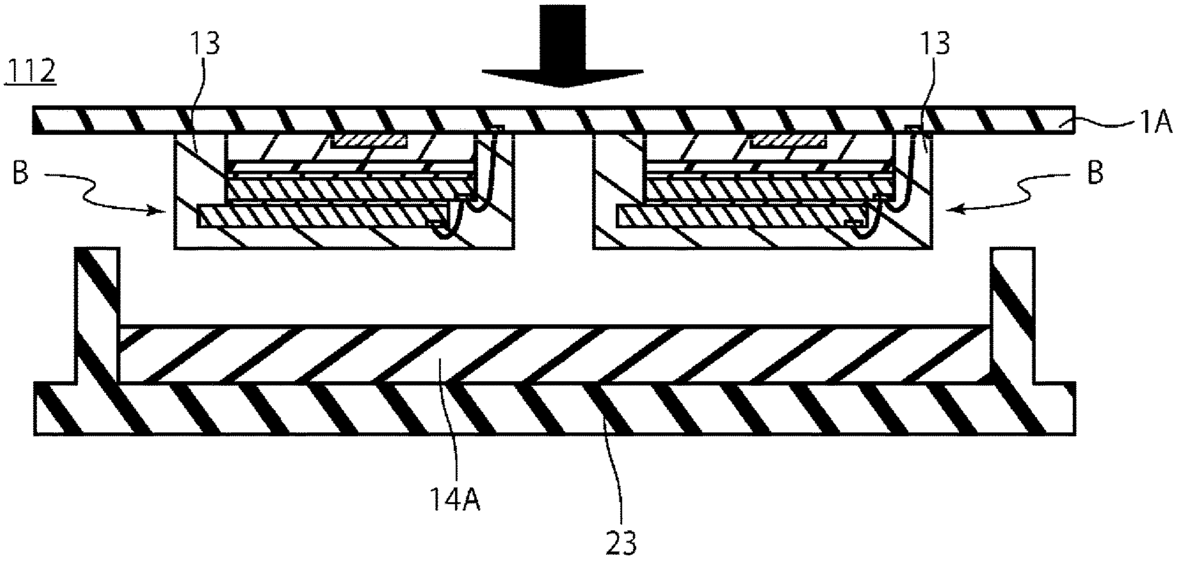
FIG. 16 is a process schematic view of the method of manufacturing the semiconductor device according to the embodiment.

The process (S03) of forming the second resin layer 14 on the first resin layer 13 will be described with reference to the process schematic view in FIG. 16. In the process (S03) of forming the second resin layer 14 on the first resin layer 13 according to the second embodiment, compression molding is adopted. In the process schematic view of FIG. 16, the member 112 obtained in the process (S02) of sealing the first semiconductor element 2 with the first resin layer 13 faces a fourth mold 23 in which a precursor 14A is inside. The precursor 14A is a resin composition before the second resin layer 14 is cured. The member 112 is pressed against the fourth mold 23 in a direction indicated by an arrow of FIG. 16 and a space between the fourth mold 23 and the member 112 is filled with the precursor 14A. Since there is a gap between the fourth mold 23 and the upper outer surface side of the first resin layer 13, the second resin layer 14 is also formed on the upper outer surface side of the first resin layer 13. The precursor 14A is cured to form the second resin layer 14 on the outer surface of the first resin layer 13.

Figure 17:
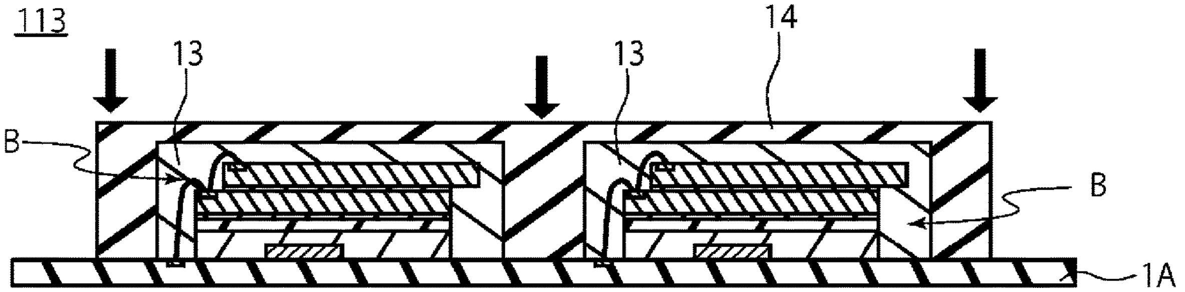
FIG. 17 is a process schematic view of the method of manufacturing the semiconductor device according to the embodiment.
Figure 18:
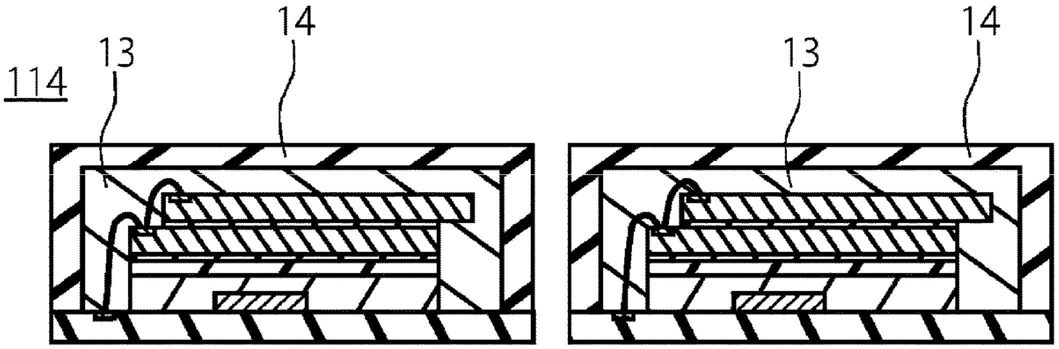
FIG. 18 is a process schematic view of the method of manufacturing the semiconductor device according to the embodiment.

The process (S04) of dividing a member in which the second resin layer 14 is formed will be described with reference to the process schematic views of FIGS. 17 and 18. In a member 113 illustrated in the process schematic view of FIG. 17, the fourth mold 23 is detached and the precursor 14A is cured to form the second resin layer 14. In the member 113 of FIG. 17, portions on which dicing is performed are indicated by arrows. When the second resin layer 14 and the wiring substrate 1A are cut in the portions indicated by the arrows, a divided member 114 illustrated in the process schematic view of FIG. 18 is obtained. For example, by forming solder balls 12 in the divided member 114, the semiconductor device 110 is obtained.

In the second embodiment, by providing the second resin layer 14 on the outer surface side of the first resin layer 13, deformation of the semiconductor device 110 is also prevented. By also providing the second resin layer 14 on the upper surface side of the semiconductor device 110, the deformation is efficiently prevented while reducing the thickness of the semiconductor device 110. Since an inner configuration of the semiconductor device 110 is not limited by the case where the second resin layer 14 is provided, the semiconductor device 110 according to the second embodiment has a different inner configuration from the semiconductor device 100 according to the first embodiment. In accordance with the inner configuration of the semiconductor device, a deformed portion or a deformation amount of the semiconductor device is different. A configuration appropriate in accordance with a deformation tendency may be adopted for the second resin layer 14.

Third Embodiment

Figure 19:
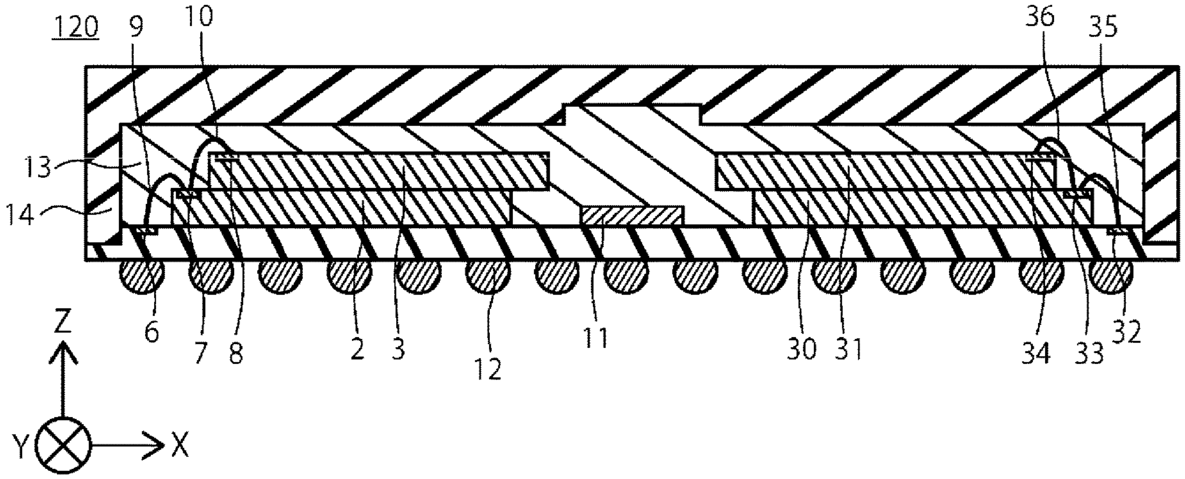
FIG. 19 is a schematic sectional view of a semiconductor device according to an embodiment.

A third embodiment relates to a semiconductor device and a method of manufacturing the semiconductor device. FIG. 19 is a schematic sectional view of a semiconductor device 120. The semiconductor device 120 according to the third embodiment is a modification of the semiconductor device 100 according to the first embodiment or the semiconductor device 110 according to the second embodiment. Common content between the first to third embodiments will not be described.

The semiconductor device 120 according to the third embodiment includes a fourth semiconductor element 30 and a fifth semiconductor element 31. In the third semiconductor device 120, the first intermediate layer 4, the second intermediate layer 5, an intermediate layer between the fourth semiconductor element 30 and the wiring substrate 1, and an intermediate layer between the fifth semiconductor element 31 and the fourth semiconductor element 30 are not illustrated. The second semiconductor element 11 is located between a stacked body of the first semiconductor element 2 and the third semiconductor element 3, and a stacked body of the fourth semiconductor element 30 and the fifth semiconductor element 31.

A pad 32 of the wiring substrate 1 is electrically connected to a pad 33 of the fourth semiconductor element 30 by a bonding wire 35. The pad 33 of the fourth semiconductor element 30 is electrically connected to a pad 34 of the fifth semiconductor element 31 by a bonding wire 36.

When the semiconductor device 120 is a storage device, the fourth semiconductor element 30 is preferably, for example, the same circuit as the first semiconductor element 2 except for an individual difference and is a semiconductor memory chip with the same structure. When the semiconductor device 120 is a storage device, the fifth semiconductor element 31 is preferably, for example, the same circuit as the first semiconductor element 2 except for an individual difference and is a semiconductor memory chip with the same structure.

There is a recess on the outer periphery of the wiring substrate 1 and the second resin layer 14 is provided in the recess portion. The semiconductor device 120 has a structure in which the second resin layer 14 is buried in the recess portion of the wiring substrate 1. When the second resin layer 14 is buried in the recess portion of the wiring substrate 1, a warpage of the wiring substrate 1 is easily further prevented by the second resin layer 14 because of an anchor effect.

There is a protrusion portion on the upper outer surface of the first resin layer 13 on the second semiconductor element 11. Since the second resin layer 14 is provided along the protrusion portion, there is a recess portion in the second resin layer 14. The thickness of the upper surface portion of the second resin layer 14 is easily changed in a mold shape used in manufacturing. By providing an uneven portion in the inner surface side of the second resin layer 14 with the outer surface of the second resin layer 14 being a flat surface, it is possible to change the thickness of the upper surface portion of the second resin layer 14. For example, a maximum value of the thickness of the upper surface portion of the second resin layer 14 may be set to be double a minimum value of the thickness of the upper surface portion of the second resin layer 14. By changing the thickness of the second resin layer 14, it is possible to enhance the bending rigidity and thinly forming a portion of which bending rigidity is desired to be lowered.

Next, a method of manufacturing the semiconductor device 120 will be described. A flowchart of the method of manufacturing the semiconductor device 120 is common to the flowchart of the method of manufacturing the semiconductor device 100. FIGS. 20 to 27 illustrate schematic process sectional views of the semiconductor device 100. In the views illustrating the processes, reference numerals of some members are omitted.

Figure 20:
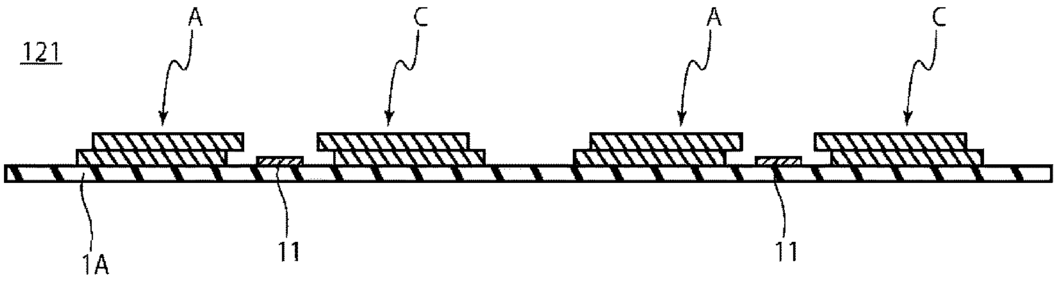
FIG. 20 is a process schematic view of the method of manufacturing the semiconductor device according to the embodiment.

The process (S01) of placing the first semiconductor element 2 on the wiring substrate 1A will be described with reference to the process schematic view of FIG. 20. As illustrated in the process schematic view of FIG. 20, the second semiconductor element 11, a stacked member A (as in the first embodiment), and a stacked member C in which the fourth semiconductor element 30 and the fifth semiconductor element 31 are stacked are placed on the wiring substrate 1A. In the process schematic view of the semiconductor device 120, some members are not illustrated. The first intermediate layer 4, the second intermediate layer 5, an intermediate layer between the fourth semiconductor element 30 and the wiring substrate 1A, and an intermediate layer between the fifth semiconductor element 31 and the fourth semiconductor element 30 are not illustrated. The pads of each semiconductor element are not illustrated either. The bonding wires 9 and 10 of the stacked member A are not illustrated. The stacked member C includes a bonding wire connecting the fourth semiconductor element 30 to the wiring substrate 1A and a bonding wire connecting the fifth semiconductor element 31 to the fourth semiconductor element 30, these bonding wires being not illustrated. In a member 121 illustrated in FIG. 20, two stacked members A, two stacked members C, and two second semiconductor elements 11 are provided on the wiring substrate 1A.

Figure 21:
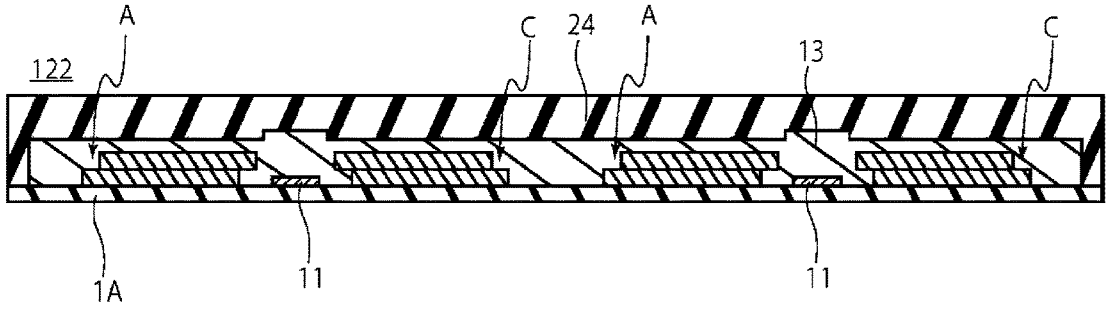
FIG. 21 is a process schematic view of a method of manufacturing the semiconductor device according to the embodiment.
Figure 22:
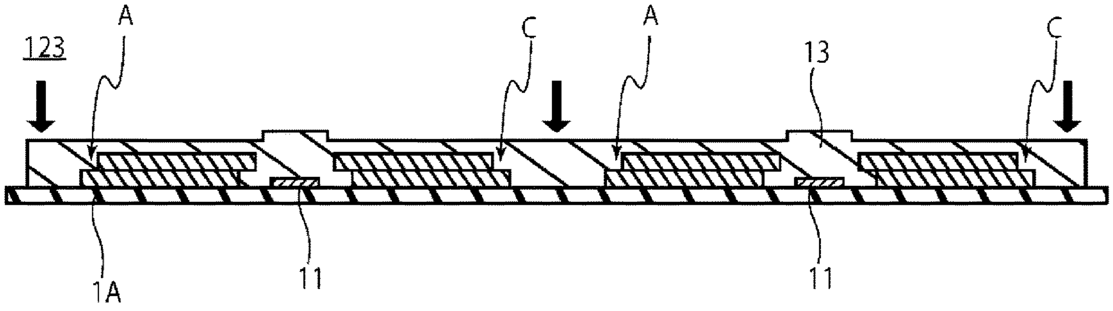
FIG. 22 is a process schematic view of the method of manufacturing the semiconductor device according to the embodiment.
Figure 23:
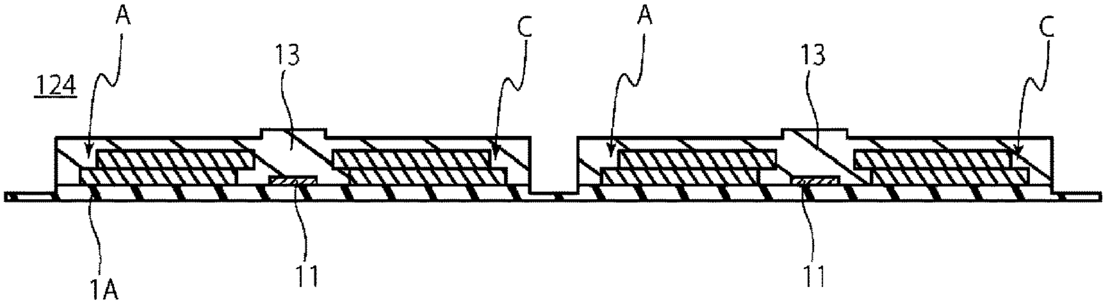
FIG. 23 is a process schematic view of the method of manufacturing the semiconductor device according to the embodiment.

The process (S02) of sealing the first semiconductor element 2 with the first resin layer 13 will be described with reference to the process schematic view of FIG. 21. In the process (S02) of sealing the first semiconductor element 2 with the first resin layer 13 according to the third embodiment, injection molding is adopted. A member 122 illustrated in the process schematic view of FIG. 21 faces a fifth mold 24. The heated precursor 13A is injected (not illustrated) and cured between the fifth mold 24 and the wiring substrate 1A to form the first resin layer 13. After the first resin layer 13 is formed, as shown in a member 123 of FIG. 22, the fifth mold 24 is detached. Cutting machining of partially scraping the wiring substrate 1A at positions indicated by arrows is performed to form grooves. In the cutting machining, it is preferable to adopt machining using a dicing blade or laser machining. When the cutting machining is performed, as illustrated in the schematic process sectional view of FIG. 23, a member 124 in which grooves are formed is obtained.

Figure 24:
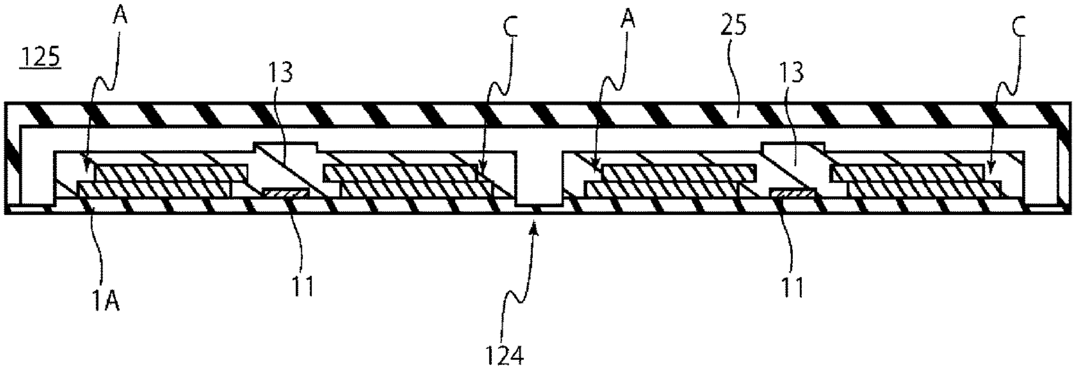
FIG. 24 is a process schematic view of the method of manufacturing the semiconductor device according to the embodiment.
Figure 25:
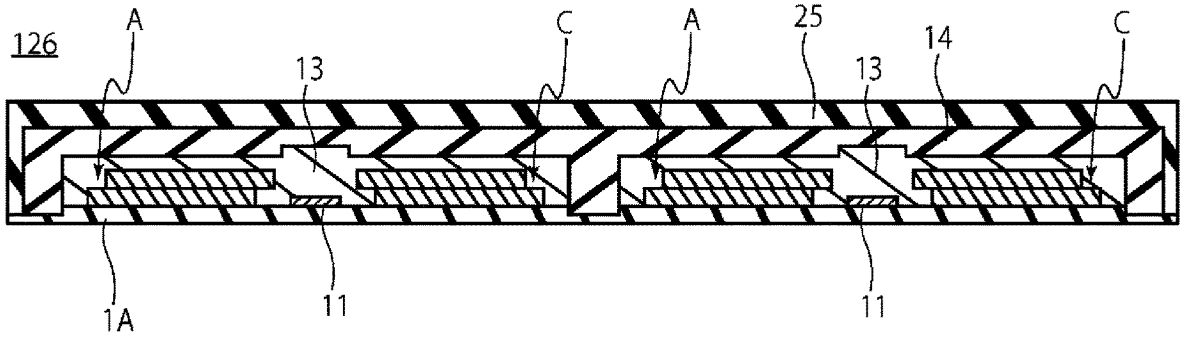
FIG. 25 is a process schematic view of the method of manufacturing the semiconductor device according to the embodiment.

The process (S03) of forming the second resin layer 14 on the first resin layer 13 will be described with reference to the process schematic views of FIGS. 24 and 25. In the process (S03) of forming the second resin layer 14 on the first resin layer 13 according to the third embodiment, injection molding is adopted. A member 125 in which the member 124 in which the grooves are formed faces a sixth mold 25 is illustrated in the process schematic view of FIG. 24. The heated precursor 14A (not illustrated) is injected and cured between the member 124 and the sixth mold 25 to obtain a member 126 illustrated in the process sectional view of FIG. 25. The member 126 is a member in which the second resin layer 14 is formed in the groove portions of the wiring substrate 1A.

Figure 26:
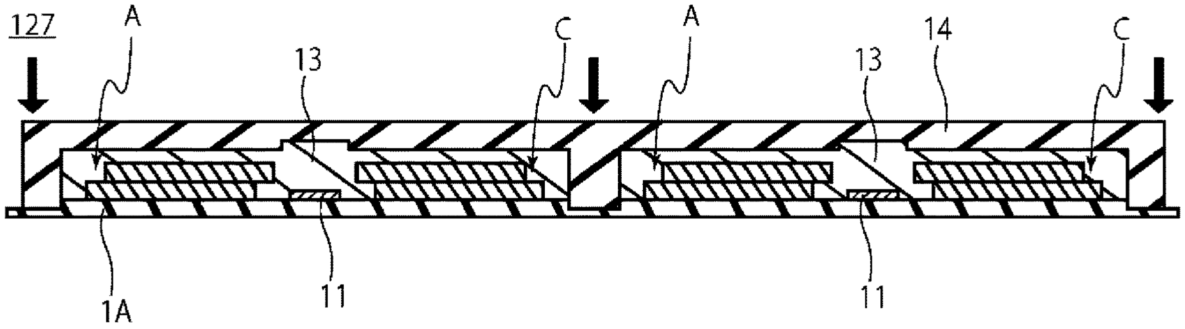
FIG. 26 is a process schematic view of the method of manufacturing the semiconductor device according to the embodiment.
Figure 27:
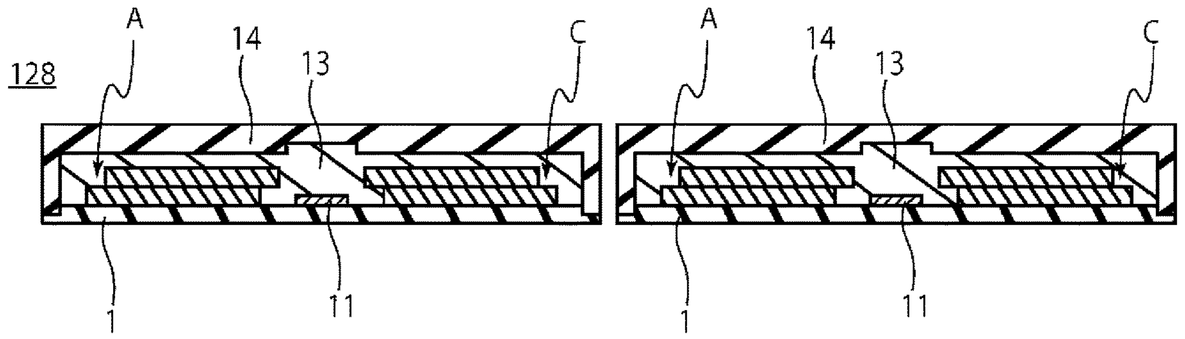
FIG. 27 is a process schematic view of the method of manufacturing the semiconductor device according to the embodiment.

The process (S04) of dividing a member in which the second resin layer 14 is formed will be described with reference to the process schematic views of FIGS. 26 and 27. A member 127 illustrated in the process schematic view of FIG. 26 is a member in which the sixth mold 25 is detached from the member 126. In the member 127 of FIG. 26, portions on which dicing is performed are indicated by arrows. When the second resin layer 14 and the wiring substrate 1A are cut in the portions indicated by the arrows, a divided member 127 illustrated in the process schematic view of FIG. 27 is obtained. For example, by forming the solder balls 12 in the divided member 128, the semiconductor device 120 is obtained.

In the third embodiment, by providing the second resin layer 14 on the outer surface side of the first resin layer 13, deformation of the semiconductor device 120 is also prevented. By also providing the second resin layer 14 on the upper surface side of the semiconductor device 120, the deformation is efficiently prevented while reducing the thickness of the semiconductor device 120. Since an inner configuration of the semiconductor device 120 is not limited by the case where the second resin layer 14 is provided, the semiconductor device 110 according to the second embodiment has a different inner configuration from the semiconductor device 100 according to the first embodiment. When there is a margin in the cutting machining on the first resin layer 13, a configuration appropriate for a tendency of the deformation may also be adopted for the second resin layer 14.

Fourth Embodiment

Figure 28:
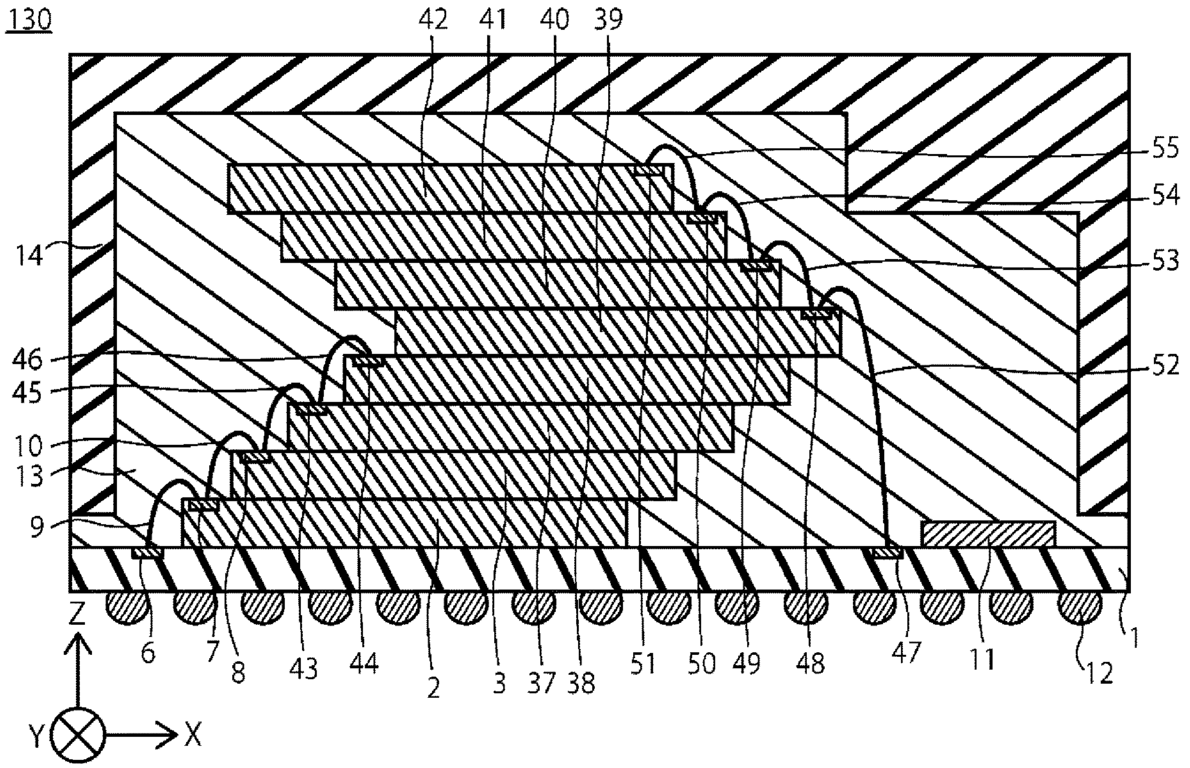
FIG. 28 is a schematic sectional view of a semiconductor device according to an embodiment.

A fourth embodiment relates to a semiconductor device and a method of manufacturing the semiconductor device. FIG. 28 is a schematic sectional view of a semiconductor device 130. The semiconductor device 130 according to the fourth embodiment is a modification of the semiconductor device 100 according to the first embodiment to the semiconductor device 120 according to the third embodiment. Common content between the first to fourth embodiments will not be described.

The semiconductor device 130 according to the fourth embodiment is a storage device in which eight memory chips are stacked including the first semiconductor element 2. The semiconductor device 130 includes the first semiconductor element 2, the third semiconductor element 3, a sixth semiconductor element 37, a seventh semiconductor element 38, an eighth semiconductor element 39, a ninth semiconductor element 40, a tenth semiconductor element 41, and an eleventh semiconductor element 42 on the wiring substrate 1. In the semiconductor device 130, the first intermediate layer 4 and an interlayer between the stacked semiconductor elements are not illustrated. The first semiconductor element 2, the third semiconductor element 3, the sixth semiconductor element 37, the seventh semiconductor element 38, the eighth semiconductor element 39, the ninth semiconductor element 40, the tenth semiconductor element 41, and the eleventh semiconductor element 42 are referred to as a stacked member D in some cases.

The pad 8 of the third semiconductor element 3 is connected to a pad 43 of the sixth semiconductor element 37 by a bonding wire 45 to electrically connect the third semiconductor element 3 to the sixth semiconductor element 37. The pad 43 of the sixth semiconductor element 37 is connected to a pad 44 of the seventh semiconductor element 38 by a bonding wire 46 to electrically connect the sixth semiconductor element 37 to the seventh semiconductor element 38. A pad 47 of the wiring substrate 1 is connected to a pad 48 of the eighth semiconductor element 39 by a bonding wire 52 to electrically connect the wiring substrate 1 to the eighth semiconductor element 39. The pad 48 of the eighth semiconductor element 39 is connected to a pad 49 of the ninth semiconductor element 40 by a bonding wire 53 to electrically connect the eighth semiconductor element 39 to the ninth semiconductor element 40. A pad 50 of the ninth semiconductor element 40 is connected to the pad 50 of the tenth semiconductor element 41 by a bonding wire 54 to electrically connect the ninth semiconductor element 40 to the tenth semiconductor element 41. The pad 50 of the tenth semiconductor element 41 is connected to a pad 51 of the eleventh semiconductor element 42 by a bonding wire 55 to electrically connect the tenth semiconductor element 41 to the eleventh semiconductor element 42.

The bottom surface (the lower bottom surface) of the second resin layer 14 is not in direct contact with the wiring substrate 1 and is in direct contact with the first resin layer 13. The second resin layer 14 becomes thick on the second semiconductor element 11.

when the semiconductor device 130 is a storage device, the sixth semiconductor element 37, the seventh semiconductor element 38, the eighth semiconductor element 39, the ninth semiconductor element 40, the tenth semiconductor element 41, and the eleventh semiconductor element 42 are each preferably the same circuit as the first semiconductor element 2 except for an individual difference and a semiconductor memory chip with the same structure.

An outer peripheral portion of the wiring substrate 1 is not in direct contact with the second resin layer 14 and the first resin layer 13 is provided between the second resin layer 14 and the wiring substrate 1. The configuration of the semiconductor device 130 is changed in accordance with a thickness or physical property of a member. The deformation of the wiring substrate 1 and the second resin layer 14 is alleviated by the first resin layer 13, and thus the deformation of the semiconductor device 130 can be prevented.

There is a protrusion portion on the upper outer surface of the first resin layer 13 on the second semiconductor element 11. Since the second resin layer 14 is provided along the protrusion portion, there is a recess portion in the second resin layer 14. The thickness of the upper surface portion of the second resin layer 14 is easily changed by a mold shape used in manufacturing. By providing an uneven portion on the inner surface side of the second resin layer 14 with the outer surface side of the second resin layer 14 being a flat surface, it is possible to change the thickness of the upper surface portion of the second resin layer 14. For example, a maximum value of the thickness of the upper surface portion of the second resin layer 14 may be set to be double or more a minimum value of the thickness of the upper surface portion of the second resin layer 14. By changing the thickness of the second resin layer 14, it is possible to enhance the bending rigidity and thinly forming a portion of which bending rigidity is desired to be lowered.

Next, a method of manufacturing the semiconductor device 130 will be described. A flowchart of the method of manufacturing the semiconductor device 130 is common to the flowchart of the method of manufacturing the semiconductor device 100. FIGS. 29 to 36 illustrate schematic process sectional views of the semiconductor device 130. In the views illustrating the processes, reference numerals of some members are omitted.

Figure 29:
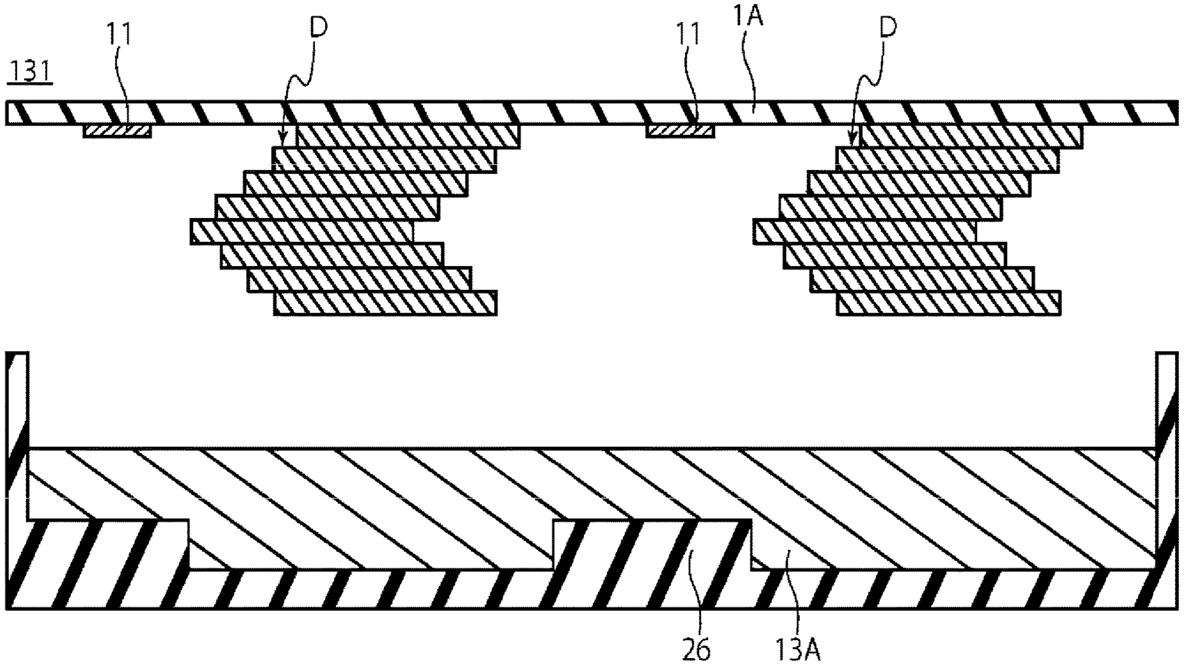
FIG. 29 is a process schematic view of a method of manufacturing the semiconductor device according to the embodiment.

The process (S01) of placing the first semiconductor element 2 on the wiring substrate 1A will be described with reference to the process schematic view of FIG. 29. As illustrated in the process schematic view of FIG. 29, the stacked member D and the second semiconductor element 11 are provided on the wiring substrate 1A. The number of stacked semiconductor elements is different, but the method of manufacturing the semiconductor elements is similar to that of the first embodiment. The bonding wires are formed in the similar manner. In the process schematic view of FIG. 29, two stacked members D and the second semiconductor element 11 are provided on the wiring substrate 1A.

Figure 30:
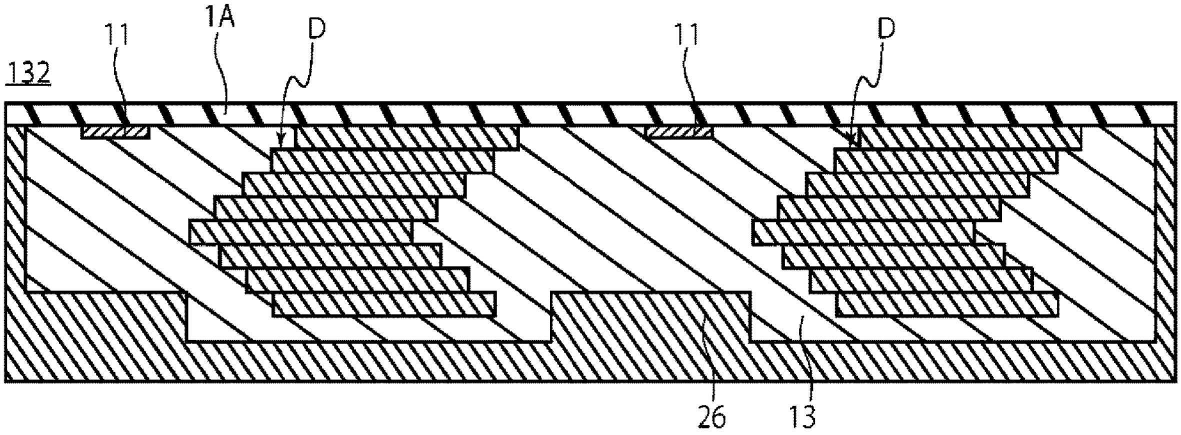
FIG. 30 is a process schematic view of the method of manufacturing the semiconductor device according to the embodiment.

The process (S02) of sealing the first semiconductor element 2 with the first resin layer 13 will be described with reference to the process schematic views of FIGS. 29 and 30. In the process (S02) of sealing the first semiconductor element 2 with the first resin layer 13 according to the fourth embodiment, compression molding is adopted. In a member 131 illustrated in the process schematic view of FIG. 29, a member in which two stacked members D and the second semiconductor element 11 are provided on the wiring substrate 1A faces a seventh mold 26. The heated precursor 13A is inside the seventh mold 26. The wiring substrate 1A is pressed against the seventh mold 26 in a direction indicated by an arrow of FIG. 14 and a space between the seventh mold 26, and the wiring substrate 1A, the stacked member D, and the second semiconductor element 11 is filled with the precursor 13A in conformity with the shape of the seventh mold 26. The precursor 13A is cured to obtain a member 132 illustrated in FIG. 30. The stacked members D and the second semiconductor element 11 are sealed with the first resin layer 13.

Figure 31:
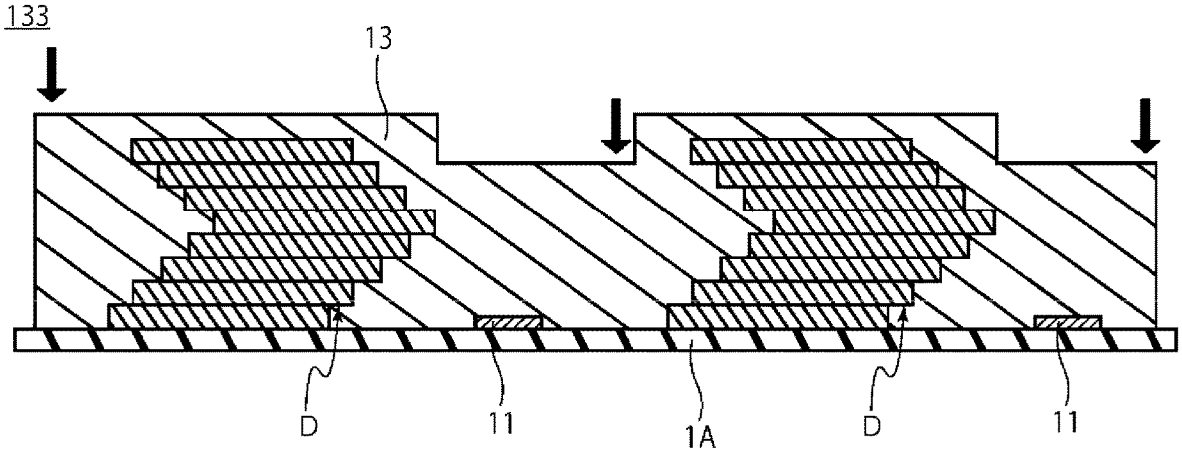
FIG. 31 is a process schematic view of the method of manufacturing the semiconductor device according to the embodiment.
Figure 32:
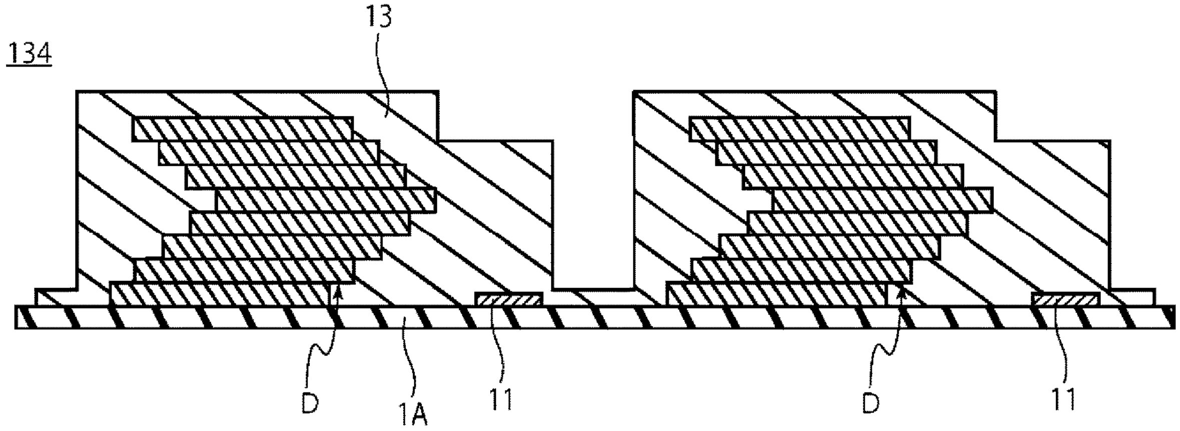
FIG. 32 is a process schematic view of the method of manufacturing the semiconductor device according to the embodiment.

After the first resin layer 13 is formed, as shown in the member 133 of FIG. 31, the seventh mold 26 is detached and cutting machining is performed up to about a depth in which the first resin layer 13 partially remains without scraping the wiring substrate 1A at positions indicated by arrows to form grooves. When the cutting machining is performed, as illustrated in the process schematic view of FIG. 32, a member 134 in which the grooves are formed is obtained. In the member 134 of FIG. 32, a cutting depth in the cutting machining is the same in three portions. However, by changing the cutting depth, the thickness of the first resin layer 13 of the outer peripheral portion of the semiconductor device 130 can be partially changed.

Figure 33:
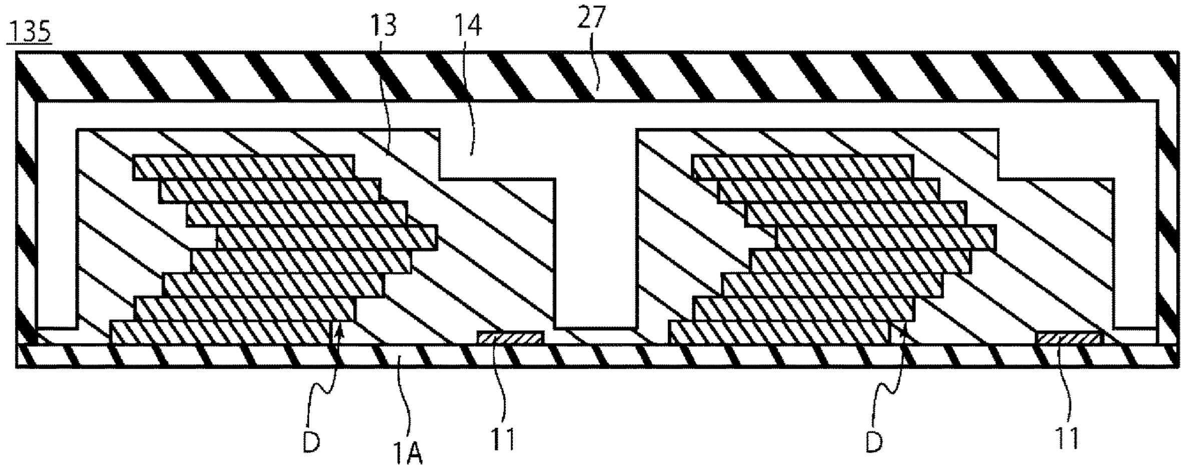
FIG. 33 is a process schematic view of the method of manufacturing the semiconductor device according to the embodiment.
Figure 34:
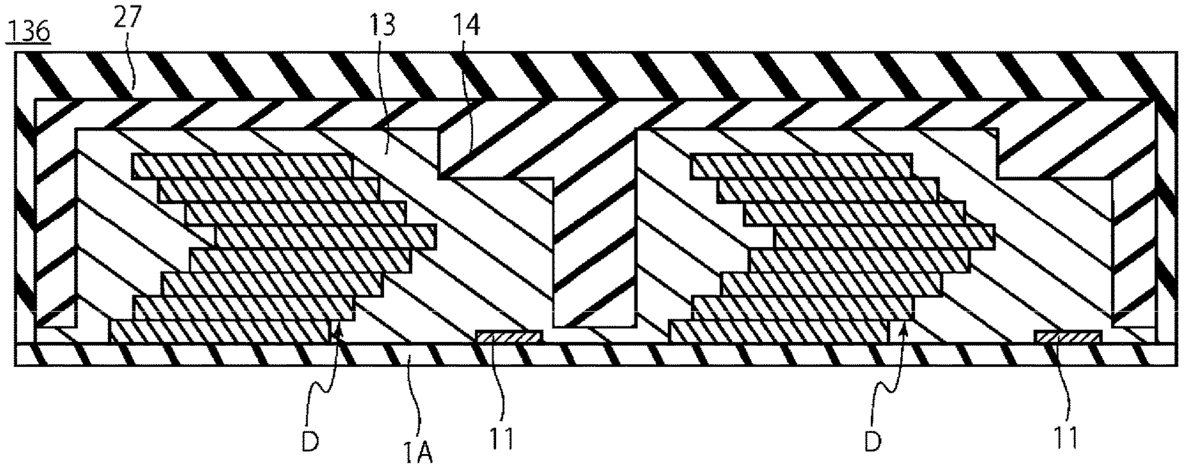
FIG. 34 is a process schematic view of the method of manufacturing the semiconductor device according to the embodiment.

The process (S03) of forming the second resin layer 14 on the first resin layer 13 will be described with reference to the process schematic views of FIGS. 33 and 34. In the process (S03) of forming the second resin layer 14 on the first resin layer 13 according to the fourth embodiment, injection molding is adopted. The process schematic view of FIG. 33 illustrates a member 135 in which the member subjected to the cutting machining faces the eighth mold 27. The heated precursor 14A (not illustrated) is injected and cured between the member subjected to the cutting machining and the eighth mold 27 to obtain a member 136 illustrated in the process sectional view of FIG. 34. The member 136 is a member in which the second resin layer 14 is formed even in the groove portions of the wiring substrate LA.

Figure 35:
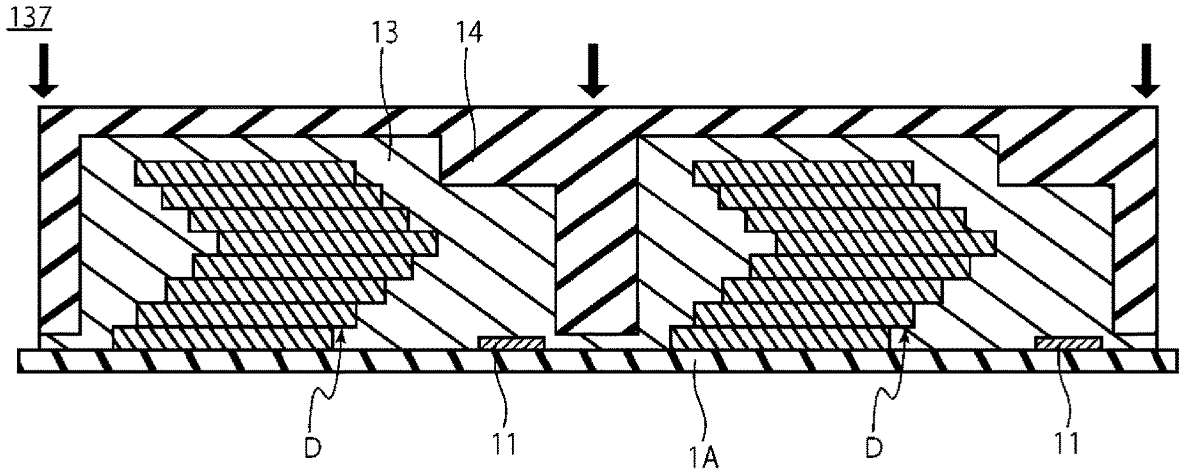
FIG. 35 is a process schematic view of the method of manufacturing the semiconductor device according to the embodiment.
Figure 36:
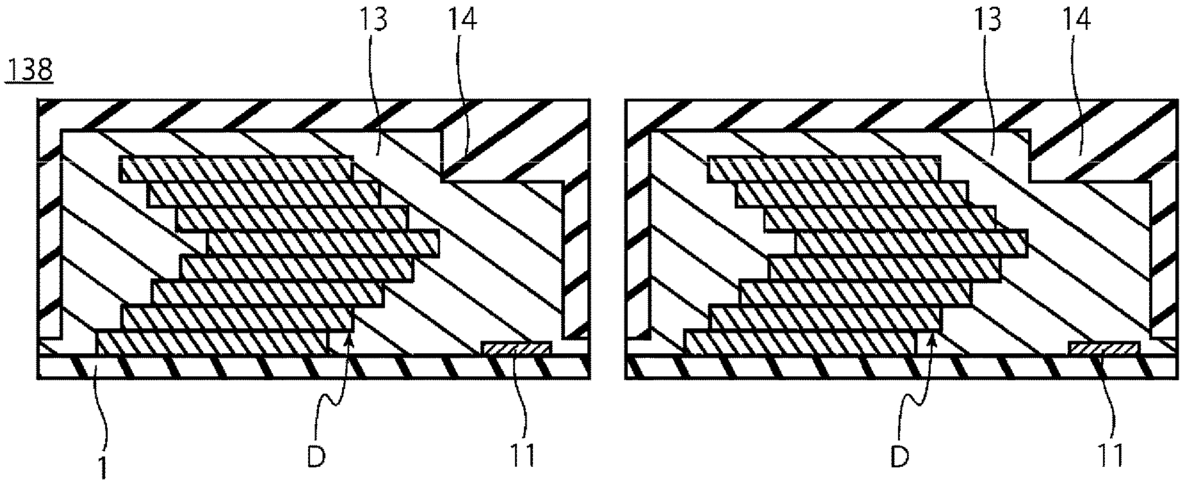
FIG. 36 is a process schematic view of the method of manufacturing the semiconductor device according to the embodiment.

The process (S04) of dividing a member in which the second resin layer 14 is formed will be described with reference to the process schematic views of FIGS. 35 and 36. A member 127 illustrated in the process schematic view of FIG. 35 is a member in which the eighth mold 27 is detached from the member 136. In the member 137 of FIG. 35, portions on which dicing is performed are indicated by arrows. When the second resin layer 14, the first resin layer 13, and the wiring substrate 1A are cut at the portions indicated by the arrows, a divided member 137 illustrated in the process schematic view of FIG. 36 is obtained. For example, by forming the solder balls 12 in the divided member 138, the semiconductor device 130 is obtained.

In the fourth embodiment, by providing the second resin layer 14 on the outer surface side of the first resin layer 13, deformation of the semiconductor device 130 is also prevented. By also providing the second resin layer 14 on the upper surface side of the semiconductor device 130, the deformation is efficiently prevented while reducing the thickness of the semiconductor device 130. For example, when many semiconductor elements are stacked, a dead space occurs on the second semiconductor element 11 in some cases. By adopting a configuration in which the second resin layer 14 is provided in the dead space, it is possible to efficiently prevent deformation of the semiconductor device 130. Even when there is a margin in the cutting machining on the first resin layer 13, a configuration appropriate for a tendency of the deformation may also be adopted for the second resin layer 14.

Hereinafter, technical opinions of a semiconductor device and a method of manufacturing the semiconductor device according to embodiments will be described.

[Technical Opinion 1]

A semiconductor device including:

a wiring substrate;

at least one first semiconductor element provided above the wiring substrate;

a first resin layer configured to seal the first semiconductor element; and a second resin layer provided on an outer surface of the first resin layer, wherein a Young's modulus of the second resin layer is greater than a Young's modulus of the first resin layer, and/or a linear thermal expansion coefficient of the second resin layer is greater than a linear thermal expansion coefficient of the first resin layer.

[Technical Opinion 2]

The semiconductor device according to Technical Opinion 1, wherein at least a portion of an inner surface of the second resin layer is in contact with an outside surface of the first resin layer.

[Technical Opinion 3]

The semiconductor device according to Technical Opinion 1, wherein the second resin layer is provided in about 50% or more and about 100% or less of an area of the outside surface of the first resin layer.

[Technical Opinion 4]

The semiconductor device according to any one of Technical Opinions 1 to 3, wherein the first resin layer includes a first resin and a first filler, and wherein the second resin layer includes a second resin and a second filler.

[Technical Opinion 5]

The semiconductor device according to any one of Technical Opinions 1 to 4, wherein the second resin layer is not in contact with the first semiconductor element.

[Technical Opinion 6]

The semiconductor device according to any one of Technical Opinions 1 to 5, wherein a thickness of the second resin layer is thinner than a thickness of the first resin layer.

[Technical Opinion 7]

The semiconductor device according to any one of Technical Opinions 1 to 6, wherein the second resin layer is in contact with the wiring substrate.

[Technical Opinion 8]

The semiconductor device according to any one of Technical Opinions 1 to 7, wherein the linear thermal expansion coefficient of the first resin layer and the linear thermal expansion coefficient of the second resin layer are reversely positive or negative.

[Technical Opinion 9]

The semiconductor device according to any one of Technical Opinions 1 to 8, wherein the second resin layer contains glass fiber or/and carbon fiber.

[Technical Opinion 10]

The semiconductor device according to any one of Technical Opinions 1 to 9, wherein the first resin layer has an insulating property, and wherein the second resin layer has a conductive property.

[Technical Opinion 11]

A method of manufacturing a semiconductor device, the method including:

placing a first semiconductor element on a wiring substrate;

sealing the first semiconductor element with a first resin layer;

forming a second resin layer on the first resin layer; and dividing a member in which the second resin layer is formed, wherein a Young's modulus of the second resin layer is greater than a Young's modulus of the first resin layer, and/or wherein a linear thermal expansion coefficient of the second resin layer is greater than a linear thermal expansion coefficient of the first resin layer.

[Technical Opinion 12]

The method of manufacturing a semiconductor device according to Technical Opinion 11, wherein the second resin layer is formed on an outside surface of the first resin layer.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
- a wiring substrate;
- at least one first semiconductor element provided above the wiring substrate and connected to the wiring substrate by a bonding wire;
- a first resin layer configured to seal a side surface and an upper surface of the first semiconductor element; and
- a second resin layer provided on an outer surface of the first resin layer,
- wherein a Young's modulus of the second resin layer is greater than a Young's modulus of the first resin layer and a Young's modulus of the wiring substrate, and/or a linear thermal expansion coefficient of the second resin layer is greater than a linear thermal expansion coefficient of the first resin layer and a linear thermal expansion coefficient of the wiring substrate, and
- the Young's modulus of the wiring substrate is greater than the Young's modulus of the first resin layer, and/or the linear thermal expansion coefficient of the wiring substrate is greater than the linear thermal expansion coefficient of the first resin layer.

2. The semiconductor device according to claim 1, wherein at least a portion of an inner surface of the second resin layer is in contact with an outside surface of the first resin layer.

3. The semiconductor device according to claim 1, wherein the second resin layer is provided in about 50% or more and about 100% or less of an area of the outside surface of the first resin layer.

4. The semiconductor device according to claim 1,
- wherein the first resin layer includes a first resin and a first filler, and
- wherein the second resin layer includes a second resin and a second filler.

5. The semiconductor device according to claim 1, wherein the second resin layer is not in contact with the first semiconductor element.

6. The semiconductor device according to claim 1, wherein a thickness of the second resin layer is thinner than a thickness of the first resin layer.

7. The semiconductor device according claim 1, wherein the second resin layer is in contact with the wiring substrate.

8. The semiconductor device according to claim 1, wherein the linear thermal expansion coefficient of the first resin layer and the linear thermal expansion coefficient of the second resin layer are reversely positive or negative.

9. The semiconductor device according to claim 1, wherein the second resin layer contains glass fiber or/and carbon fiber.

10. The semiconductor device according to claim 1,
- wherein the first resin layer has an insulating property, and
- wherein the second resin layer has a conductive property.

11. The method of manufacturing a semiconductor device according to claim 1, wherein
- an upper surface of the first resin is higher than an upper surface of the first semiconductor element.

12. The method of manufacturing a semiconductor device according to claim 4, wherein
- the first filler is an inorganic oxide particle including silica or/and alumina, and
- the second filler is one or more types selected from a group configured with an inorganic oxide particle including a silica particle and an alumina particle, and metal particle.

13. The method of manufacturing a semiconductor device according to claim 4, wherein
- an average primary diameter of the first filler is 1 μm or more and 80 μm or less, and
- an average primary diameter of the first filler is 10 μm or more and 100 μm or less.

14. The method of manufacturing a semiconductor device according to claim 4, wherein
- a difference between a maximum value and a minimum value of the filling rate of the second filler is 0 Vol % or more and 30 Vol % or less.

15. The method of manufacturing a semiconductor device according to claim 1, wherein
- the Young's modulus of the first resin layer, the second resin layer, and the wiring substrate are values in a range of 20° C. or more and 150° C. or less.

16. The method of manufacturing a semiconductor device according to claim 1, wherein
- the Young's modulus of the second resin layer is 30 GPa or more and 100 Pa or less.

17. The method of manufacturing a semiconductor device according to claim 1, wherein
- a difference between the linear thermal expansion coefficients of the second resin layer and the linear thermal expansion coefficients of first resin layer is $1\times10^{-6}$/K or more and $10\times10^{-6}$/K or less.

18. The method of manufacturing a semiconductor device according to claim 1, wherein
- the linear thermal expansion coefficient of the first resin layer is less than 0/K and the linear thermal expansion coefficient of the second resin layer is greater than 0/K.

* * * * *